(12) United States Patent
Jahelka et al.

(10) Patent No.: US 12,402,418 B2
(45) Date of Patent: Aug. 26, 2025

(54) SYSTEMS AND METHODS FOR NON-EPITAXIAL HIGH SCHOTTKY-BARRIER HETEROJUNCTION SOLAR CELLS

(71) Applicant: California Institute of Technology, Pasadena, CA (US)

(72) Inventors: Phillip R. Jahelka, Altadena, CA (US); Rebecca D. Glaudell, Des Plaines, IL (US); Harry A. Atwater, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 17/346,828

(22) Filed: Jun. 14, 2021

(65) Prior Publication Data

US 2021/0391486 A1 Dec. 16, 2021

Related U.S. Application Data

(60) Provisional application No. 63/038,546, filed on Jun. 12, 2020.

(51) Int. Cl.
| | |
|---|---|
| *H10F 10/18* | (2025.01) |
| *B82Y 30/00* | (2011.01) |
| *B82Y 40/00* | (2011.01) |
| *H10F 10/163* | (2025.01) |
| *H10F 19/80* | (2025.01) |

(Continued)

(52) U.S. Cl.
CPC ........... *H10F 10/18* (2025.01); *H10F 10/163* (2025.01); *H10F 19/804* (2025.01); *H10F 77/1243* (2025.01); *H10F 77/1437* (2025.01); *H10F 77/211* (2025.01); *H10K 30/10* (2023.02);

(Continued)

(58) Field of Classification Search
CPC ............... H01L 31/072; H01L 31/0735; H01L 31/0304–03042; H01L 31/07; H01L 51/42–448; H10K 30/10; H10K 30/50; H10F 10/18; H10F 10/163; H10F 19/804; H10F 77/211; H10F 77/1437; H10F 77/1243

See application file for complete search history.

(56) References Cited

U.S. PATENT DOCUMENTS

| | | |
|---|---|---|
| 3,278,811 A | 10/1966 | Hiroshi |
| 4,621,898 A | 11/1986 | Cohen |

(Continued)

FOREIGN PATENT DOCUMENTS

| | | |
|---|---|---|
| CN | 101598717 A | 12/2009 |
| WO | 2016111576 A1 | 7/2016 |

(Continued)

OTHER PUBLICATIONS

Yan et al, Real Function of Semiconducting Polymer in GaAs/Polymer Planar Heterojunction Solar Cells, Acs Nano 7.8 (2013): 6619-6626. (Year: 2013).*

(Continued)

*Primary Examiner* — Andrew J Golden
(74) *Attorney, Agent, or Firm* — KPPB LLP

(57) ABSTRACT

Systems and methods of non-epitaxial high Schottky barriers heterojunction solar cells are described. The high Schottky barriers heterojunction solar cells are formed using non-epitaxial methods to reduce fabrication costs and improve scalability.

8 Claims, 8 Drawing Sheets

(51) Int. Cl.
*H10F 77/124* (2025.01)
*H10F 77/14* (2025.01)
*H10F 77/20* (2025.01)
*H10K 30/10* (2023.01)
*H10K 30/50* (2023.01)

(52) U.S. Cl.
CPC .............. *B82Y 30/00* (2013.01); *B82Y 40/00* (2013.01); *H10K 30/50* (2023.02)

(56) References Cited

U.S. PATENT DOCUMENTS

| | | | |
|---|---|---|---|
| 4,771,017 | A | 9/1988 | Tobin et al. |
| 5,075,262 | A | 12/1991 | Nguyen et al. |
| 5,076,857 | A | 12/1991 | Nowlan |
| 5,122,215 | A | 6/1992 | Shibata et al. |
| 6,473,220 | B1 | 10/2002 | Clikeman et al. |
| 6,573,445 | B1 | 6/2003 | Burgers |
| 6,768,048 | B2 | 7/2004 | Woll et al. |
| 7,573,550 | B2 | 8/2009 | Lubart et al. |
| 7,595,934 | B2 | 9/2009 | Lubart et al. |
| 8,202,566 | B2 | 6/2012 | Davidson et al. |
| 8,648,248 | B2 | 2/2014 | Rodriguez-Parada et al. |
| 9,750,141 | B2 | 8/2017 | Noy |
| 11,041,338 | B2 | 6/2021 | Saive et al. |
| 11,362,229 | B2 | 6/2022 | Jahelka et al. |
| 2003/0041894 | A1 | 3/2003 | Sverdrup, Jr. et al. |
| 2005/0109388 | A1 | 5/2005 | Murakami et al. |
| 2006/0038182 | A1 | 2/2006 | Rogers et al. |
| 2006/0207647 | A1 | 9/2006 | Tsakalakos et al. |
| 2006/0283498 | A1 | 12/2006 | Gronet |
| 2007/0281099 | A1 | 12/2007 | Howarth et al. |
| 2008/0072958 | A1 | 3/2008 | Dutta |
| 2008/0135089 | A1 | 6/2008 | Tsakalakos et al. |
| 2008/0176030 | A1 | 7/2008 | Fonash et al. |
| 2008/0271776 | A1 | 11/2008 | Morgan |
| 2009/0061213 | A1 | 3/2009 | Bahnmuller et al. |
| 2009/0151782 | A1 | 6/2009 | Ko et al. |
| 2009/0165844 | A1 | 7/2009 | Dutta |
| 2009/0229667 | A1 | 9/2009 | Shrotriya et al. |
| 2009/0255568 | A1 | 10/2009 | Morgan |
| 2009/0293946 | A1 | 12/2009 | Lin et al. |
| 2010/0055824 | A1 | 3/2010 | Lin et al. |
| 2010/0075261 | A1 | 3/2010 | Clevenger et al. |
| 2010/0089262 | A1 | 4/2010 | Seong et al. |
| 2010/0116316 | A1 | 5/2010 | Moslehi et al. |
| 2010/0283069 | A1 | 11/2010 | Rogers et al. |
| 2010/0307572 | A1* | 12/2010 | Bedell .................. H01L 31/074 438/96 |
| 2011/0120527 | A1 | 5/2011 | Huang et al. |
| 2011/0175085 | A1 | 7/2011 | Tiwari et al. |
| 2011/0226332 | A1 | 9/2011 | Ford et al. |
| 2011/0240104 | A1 | 10/2011 | Lee et al. |
| 2011/0315201 | A1 | 12/2011 | Lin et al. |
| 2011/0315988 | A1 | 12/2011 | Yu et al. |
| 2012/0031486 | A1 | 2/2012 | Parce et al. |
| 2012/0067400 | A1 | 3/2012 | Derryberry et al. |
| 2012/0067402 | A1 | 3/2012 | Kitai et al. |
| 2012/0132278 | A1 | 5/2012 | Winston et al. |
| 2012/0229907 | A1 | 9/2012 | Ueda |
| 2013/0014811 | A1 | 1/2013 | Bedell et al. |
| 2013/0074918 | A1 | 3/2013 | Jeong et al. |
| 2013/0210185 | A1 | 8/2013 | Yoshimi et al. |
| 2014/0000692 | A1 | 1/2014 | Fogel et al. |
| 2014/0029104 | A1 | 1/2014 | Guo et al. |
| 2014/0130864 | A1 | 5/2014 | Lunt et al. |
| 2014/0154769 | A1 | 6/2014 | Del Ninno et al. |
| 2014/0182656 | A1 | 7/2014 | Bodan et al. |
| 2014/0283896 | A1 | 9/2014 | Lunt, III et al. |
| 2014/0299181 | A1 | 10/2014 | Bedell et al. |
| 2015/0311370 | A1 | 10/2015 | Chou et al. |
| 2016/0087135 | A1 | 3/2016 | Horimai et al. |
| 2016/0289248 | A1* | 10/2016 | Johnson .................. C07F 7/081 |
| 2016/0302305 | A1 | 10/2016 | Chang et al. |
| 2016/0313640 | A1 | 10/2016 | Cok et al. |
| 2016/0322514 | A1 | 11/2016 | Atwater et al. |
| 2016/0380220 | A1* | 12/2016 | Afzali-Ardakani .......... H01L 51/441 438/82 |
| 2017/0038047 | A1 | 2/2017 | Golle et al. |
| 2017/0179041 | A1 | 6/2017 | Dias et al. |
| 2017/0263796 | A1 | 9/2017 | Jahelka |
| 2017/0373206 | A1 | 12/2017 | Knorr, Jr. et al. |
| 2018/0248064 | A1 | 8/2018 | Lunt et al. |
| 2018/0337297 | A1 | 11/2018 | Murofushi et al. |
| 2019/0067504 | A1 | 2/2019 | Needell et al. |
| 2019/0074401 | A1 | 3/2019 | Saive et al. |
| 2019/0148574 | A1 | 5/2019 | Saive et al. |
| 2019/0312168 | A1 | 10/2019 | Jahelka et al. |
| 2019/0326460 | A1 | 10/2019 | Needell et al. |
| 2020/0028005 | A1 | 1/2020 | Saive et al. |
| 2020/0063487 | A1 | 2/2020 | Saive et al. |
| 2020/0241186 | A1 | 7/2020 | Ohta et al. |

FOREIGN PATENT DOCUMENTS

| | | |
|---|---|---|
| WO | 2019035094 A1 | 2/2019 |
| WO | 2019099733 A1 | 5/2019 |
| WO | 2019139996 A1 | 7/2019 |
| WO | 2019204809 A1 | 10/2019 |

OTHER PUBLICATIONS

Aboelfotoh et al, Novel low-resistance ohmic contact to n-type GaAs using Cu3Ge, Appl. Phys. Lett. 65, 3245 (1994). (Year: 1994).*

Peczonczyk, Heterogeneous Organic Reactions on Gallium-Rich Gallium Arsenide, Gallium Phosphide, and Gallium Nitride Surfaces, Dissertation University of Michigan 2014. (Year: 2014).*

Raj et al, Non-epitaxial carrier selective contacts for III-V solar cells: A review, Applied Materials Today 18 (2020) 100503. (Year: 2020).*

Uebbing et al, Behavior of Cesium Oxide as a Low Work-Function Coating, Journal of Applied Physics 41, 4505 (1970) (Year: 1970).*

Islam et al, Metal/Insulator/Semiconductor Carrier Selective Contacts for Photovoltaic Cells, 2014 IEEE 40th Photovoltaic Specialist Conference (PVSC). IEEE, 2014. (Year: 2014).*

Kundu et al, Electrical properties and barrier modification of GaAs MIS Schottky device based on MEH-PPV organic interfacial layer, vol. 15, Issue 4, Aug. 2012, pp. 386-392 (Year: 2012).*

Mangal et al, Aluminum/polyaniline/GaAs metal-insulator-semiconductor solar cell: Effect of tunneling on device performance, Applied Physics Letters 94, 223509 (2009) (Year: 2009).*

International Preliminary Report on Patentability for International Application No. PCT/US2019/012916, Report issued Jul. 14, 2020, Mailed Jul. 23, 2020, 8 Pgs.

International Preliminary Report on Patentability for International Application PCT/US2019/028522, Report issued Oct. 20, 2020, Mailed Oct. 29, 2020, 7 Pgs.

International Search Report and Written Opinion for International Application No. PCT/IB2018/056249, Search completed Nov. 8, 2018, Mailed Dec. 20, 2018, 14 Pgs.

International Search Report and Written Opinion for International Application No. PCT/US2018/061373, Search completed Mar. 6, 2019, Mailed Mar. 7, 2019, 10 Pgs.

International Search Report and Written Opinion for International Application No. PCT/US2019/012916, Search completed May 3, 2019, Mailed May 7, 2019, 10 Pgs.

International Search Report and Written Opinion for International Application No. PCT/US2019/028522, Search completed Sep. 4, 2019, Mailed Sep. 4, 2019, 8 Pgs.

Åberg et al., "A GaAs Nanowire Array Solar Cell with 15.3% Efficiency at 1 Sun", IEEE Journal of Photovoltaics, vol. 6, No. 1, Jan. 2016, pp. 185-190, doi: 10.1109/JPHOTOV.2015.2484967.

Adams et al., "Are Global Wind Power Resource Estimates Overstated?", Environmental Research Letters, vol. 8, No. 15021, Feb. 25, 2013, pp. 1-9, doi: 10.1088/1748-9326/8/1/015021.

(56) References Cited

OTHER PUBLICATIONS

Afshinmanesh et al., "Transparent Metallic Fractal Electrodes for Semiconductor Devices", Nano letters, vol. 14, Aug. 20, 2014, pp. 5068-5074, doi: dx.doi.org/10.1021/nl501738b.
Andrews et al., "The Effect of Spectral Albedo on Amorphous Silicon and Crystalline Silicon Solar Photovoltaic Device Performance", Solar Energy, vol. 91, 2013, pp. 233-241.
Arora et al., "Perovskite Solar Cells with CuSCN Hole Extraction Layers Yield Stabilized Efficiencies Greater than 20%", Science, vol. 358, No. Nov. 10, 2017, pp. 768-771, doi: 10.1126/science.aam5655.
Arvo, James "Backward Ray Tracing", Developments in Ray Tracing, Siggraph '86 Course Notes, Apollo Computer Inc., vol. 12, Aug. 1986, pp. 1-8.
Baruch et al., "On Some Thermodynamic Aspects of Photovoltaic Solar Energy Conversion", Solar Energy Materials and Solar Cells, vol. 36, 1995, pp. 201-222.
Batchelder, J. S., "The Luminescent Solar Concentrator", Thesis, California Institute of Technology, 1982, 287 Pgs.
Blakers, A. W. "Shading Losses of Solar-Cell Metal Grids", Journal of Applied Physics, vol. 71, No. 10, May 15, 1992, pp. 5237-5241, doi: https://doi.org/10.1063/1.350580.
Bomm et al., "Fabrication and Spectroscopic Studies on Highly Luminescent CdSe/CdS Nanorod Polymer Composites", Beilstein Journal of Nanotechnology, vol. 1, Nov. 29, 2010, pp. 94-100, doi: 10.3762/bjnano. 1.11.
Brennan et al., "Effects of Spectral Albedo on Solar Photovoltaic Devices", Solar Energy Materials and Solar Cells, vol. 124, 2014, pp. 1-13, doi: http://dx.doi.org/10.1016/j.solmat.2014.01.046.
Bronstein et al., "Luminescent Solar Concentration with Semiconductor Nanorods and Transfer-Printed Micro-Silicon Solar Cells", ACS Nano, vol. 8, No. 1, Dec. 19, 2013, pp. 44-53.
Bronstein et al., "Quantum Dot Luminescent Concentrator Cavity Exhibiting 30-Fold Concentration", ACS Phototonics, vol. 2, Aug. 17, 2015, pp. 1576-1583, doi:10.1021/acsphotonics.5b00334.
Burgers, A. R. "How to Design Optimal Metallization Patterns for Solar Cells", Progress in Photovoltaics: Research and Applications, vol. 7, May 4, 1999, pp. 457-461.
Carlson et al., "Transfer Printing Techniques for Materials Assembly and Micro/Nanodevice Fabrication", Advanced Materials, vol. 24, Aug. 31, 2012, pp. 5284-5318, doi: 10.1002/adma.201201386.
Chen et al., "Compact High-Quality CdSe/CdS Core/Shell Nanocrystals with Narrow Emission Linewidths and Suppressed Blinking", Nature Materials, vol. 12, No. 5, May 2013, 14 Pgs, doi: 10.1038/nnmat3539.
Chen et al., "Increasing Light Capture in Silicon Solar Cells with Encapsulants Incorporating Air Prisms to Reduce Metallic Contact Losses", Optics Express A1419, vol. 24, No. 22, Oct. 31, 2016, 12 Pgs., doi: http://dx.doi.org/10.1364/OE.24.0A1419.
Coropceanu et al., "Core/Shell Quantum Dot Based Luminescent Solar Concentrators with Reduced Reabsorption and Enhanced Efficiency", Nano Letters, vol. 14, Jun. 6, 2014, pp. 4097-4101, doi: dx.doi.org/10.1021/nl501627e.
Cuevas et al., "50 Per Cent More Output Power from an Albedo-Collecting Flat Panel Using Bifacial Solar Cells", Solar Energy, vol. 29, No. 5, 1982, pp. 419-420.
Dam et al., "High-Efficiency Nanowire Solar Cells with Omnidirectionally Enhanced Absorption Due to Self-Aligned Indium-Tin-Oxide Mie Scatterers", ACS Nano, vol. 10, Nov. 29, 2016, pp. 11414-11419, doi: 10.1021/acsnano.6b06874.
De Souza et al., "Inversion Mode n-Channel GaAs Field Effect Transistor with High-k/Metal Gate", Applied Physics Letters, vol. 92, Apr. 16, 2008, pp. 153508-1-153508-2, doi: 10.1063/1.2912027.
Debije et al., "Thirty Years of Luminescent Solar Concentrator Research: Solar Energy for the Built Environment", Advanced Energy Materials, vol. 2, 2012, pp. 12-35, doi: 10.1002/aenm.201100554.
Deline et al., "Evaluation and Field Assessment of Bifacial Photovoltaic Module Power Rating Methodologies", 43rd IEEE Photovoltaic Specialists Conference (PVSC), Portland, Oregon, Jun. 5-10, 2016, 6 Pgs.
Divitt et al., "Spatial Coherence of Sunlight and its Implications for Light Management in Photovoltaics", Optica, vol. 2, No. 2, Feb. 2015, pp. 95-103, doi: http://dx.doi.org/10.1364/OPTICA.2.000095.
Ellmer, Klaus "Past Achievements and Future Challenges in the Development of Optically Transparent Electrodes", Nature Photonics, vol. 6, Dec. 2012, pp. 809-817, published online Nov. 30, 2012, doi: 10.1038/NPHOTON.2012.282.
Essig et al., "Mechanically Stacked 4-Terminal III-V/Si Tandem Solar Cells", IEEE 44th Photovoltaic Specialists Conference, Jun. 2017, 2 Pgs.
Essig et al., "Realization of GaInP/Si Dual-Junction Solar cells with 29.8% One-Sun Efficiency", IEEE Journal of Photovoltaics, Apr. 27, 2016, 7 Pgs.
Feldmann et al., "Carrier-Selective Contacts for Si Solar Cells", Applied Physics Letters, vol. 104, May 8, 2014, pp. 181105-1-181105-4, doi: http://dx.doi.org/10.1063/1.4875904.
Ferry et al., "Light Trapping in Ultrathin Plasmonic Solar Cells", Optics Express, vol. 18, No. 102, Jun. 24, 2010, pp. A237-A245.
Fertig et al., "Bifacial Potential of Single- and Double-Sided Collecting Silicon Solar Cells", Progress in Photovoltaics: Research and Applications, vol. 24, Jan. 13, 2016, pp. 818-829, doi: 10.1002/pip.2732.
Fertig et al., "Economic Feasibility of Bifacial Silicon Solar Cells", Progress in Photovoltaics: Research and Applications, vol. 24, Jan. 14, 2016, pp. 800-817, doi: 10.1002/pip.2730.
Gallagher et al., "Quantum Dot Solar Concentrator Behaviour, Predicted Using a Ray Trace Approach", International Journal of Ambient Energy, vol. 25, No. 1, Jan. 2004, pp. 47-56.
Gangopadhyay et al., "Front Grid Design for Plated Contact Solar Cells", IEEE, 2002, pp. 399-402.
Geisz et al., "Enhanced External Radiative Efficiency for 20.8% Efficient Single-Junction GaInP Solar Cells", Applied Physical Letters, vol. 103, Jul. 25, 2013, pp. 041118-1-041118-5, doi: http://dx.do.org/10.1063/1.4816837.
Goetzberger et al., "Solar Energy Conversion with Fluorescent Collectors", Applied Physics, vol. 14, May 12, 1977, pp. 123-129.
Goldschmidt et al., "Increasing the Efficiency of Fluorescent Concentrator Systems", Solar Energy Materials and Solar Cells, vol. 93, Nov. 20, 2008, pp. 176-182, doi: 10.1016/j/solmat.2008.09.048.
Goncharov et al., "Reconstruction of the Optical System of the Human Eye with Reverse Ray-Tracing", Optics Express, vol. 16, No. 3, Feb. 4, 2008, pp. 1692-1703.
Green, Martin A. "Self-Consistent Optical Parameters of Intrinsic Silicon at 300 K Including Temperature Coefficients", Solar Energy Materials and Solar Cells, vol. 92, Jul. 25, 2008, pp. 1305-1310, doi:10.1016/j.solmat.2008.06.0009.
Groep et al., "Transparent Conducting Silver Nanowire Networks", Nano Letters, vol. 12, May 3, 2012, pp. 3138-3144, doi: dx.doi.org/10.1021/nl301045a.
Guerrero-Lemus et al., "Bifacial Solar Photovoltaics—A Technology Review", Renewable and Sustainable Energy Reviews, vol. 60, Mar. 24, 2016, pp. 1533-1549, doi: http://dx.doi.org/10.1016/j.rser.2016.03.041.
Guo et al., "Vertically Mounted Bifacial Photovoltaic Modules: A Global Analysis", Energy, vol. 61, Sep. 23, 2013, pp. 447-454, doi: http://dx.doi.org/10.1016/j.energy.2013.08.040.
Gutmann et al., "Predicting the Performance of Photonic Luminescent Solar Concentrators", IEEE 39th Photovoltaic Specialists Conference, 2013, pp. 1864-1868.
Hansen et al., "Analysis of Irradiance Models for Bifacial PV Modules", IEEE 43rd Photovoltaic Specialists Conference (PVSC), Portland, Oregon, Jun. 2016, 6 Pgs.
Henry et al., "Alumina Etch Masks for Fabrication of High-Aspect-Ratio Silicon Micropillars and Nanopillars", Nanotechnology, vol. 20, No. 255305, Jun. 2, 2009, pp. 1-4, doi: 10.1088/0957-4484/20/25/255305.

(56) References Cited

OTHER PUBLICATIONS

Henry, M. D. "ICP Etching of Silicon for Micro and Nanoscale Devices", Thesis, California Institute of Technology, May 19, 2010, 219 Pgs.
Herasimenka et al., ">750 mV Open Circuit Voltage Measured on 50 μm Thick Silicon Heterojunction Solar Cell", Applied Physics Letters, vol. 103, Aug. 1, 2013, pp. 053511-1-053511-4, doi: http://dx.doi.org/10.1063/1.4817723.
Hinkle et al., "Detection of Ga Suboxides and their Impact on III-V Passivation and Fermi-Level Pinning", Applied Physics Letters, vol. 94, Apr. 20, 2009, pp. 162101-1-162101-3, doi: 10.1063/1.3120546.
Holman et al., "Current Losses at the Front of Silicon Heterojunction Solar Cells", IEEE Journal of Photovoltaics, vol. 2, No. 1, Jan. 2012, pp. 7-15.
Honsberg et al., "Welcome to PVCDROM", PVEducation, online available at <https://web.archive.org/web/20150105234528/http://pveducation.org/pvcdrom>, Jan. 5, 2015, 1 Pg.
Horzel et al., "Advantages of a New Metallisation Structure for the Front Side of Solar Cells", 13th European Photovoltaic Solar Energy Conference, Oct. 23-27, 1995, pp. 1368-1373.
Hoye et al., "Strongly Enhanced Photovoltaic Performance and Defect Physics of Air-Stable Bismuth Oxyiodide (BiOI)", Advanced Materials, vol. 29, No. 1702176, Jul. 17, 2017, 10 Pgs., doi: 10.1002/adma.201702176.
Hsu et al., "Performance Enhancement of Metal Nanowire Transparent Conducting Electrodes by Mesoscale Metal Wires", Nature Communications, vol. 4, No. 2522, Sep. 25, 2013, pp. 1-7, doi: 10.1038/ncomm3522.
Hu et al., "Ray-Trace Simulation of CuInS(Se)2 Quantum Dot Based Luminescent Solar Concentrators", Optics Express, vol. 23, No. 15, Jul. 27, 2015, pp. A858-A867, doi:10.1364/OE.23.00A858.
Huang et al., "Fabrication of Silicon Nanowire Arrays with Controlled Diameter, Length, and Density", Advanced Materials, vol. 19, Feb. 7, 2007, pp. 744-748, doi: 10.1002/adma.200600892.
Jasieniak et al., "Re-Examination of the Size-Dependent Absorption Properties of CdSe Quantum Dots", Journal of Physical Chemistry C, vol. 113, Oct. 15, 2009, pp. 19468-19474, doi:10.1021/jp906827m.
Jiang et al., "Enhanced Electron Extraction Using SnO2 for High-Efficiency Planar-Structure HC(NH2)2PbI3-Based Perovskite Solar Cells", Nature Energy, vol. 16177, Nov. 14, 2016, pp. 1-7, doi: 10.1038/NENERGY.2016.177.
Kelzenberg, M. D., "Silicon Microwire Photovoltaics", Thesis, California Institute of Technology, May 19, 2010, 324 Pgs. (presented in 2 parts).
Kik, Pieter G. "Catoptric Electrodes: Transparent Metal Electrodes Using Shaped Surfaces", Optics Letters, vol. 39, No. 17, Sep. 1, 2014, pp. 5114-5117, doi: http://dx.doi.org/10.1364/OL39.005114.
King, D. L. "Photovoltaic Module and Array Performance Characterization Methods for all System Operating Conditions", Proceeding of NREL/SNL Photovoltaics Program Review, vol. 394, Nov. 18-22, 1996, pp. 1-22.
Klein et al., "Transparent Conductive Adhesives for Tandem Solar Cells Using Polymer—Particle Composites", ACS Applied Materials & Interfaces, vol. 10, Feb. 14, 2018, pp. 8086-8091, doi: 10.1021/acsami.8b00175.
Kopecek et al., "Bifaciality: One Small Step for Technology, One Giant Leap for kWh Cost Reduction", Photovoltaics International, Jan. 13, 2015, pp. 1-11.
Kreinin et al., "PV Systems Based on Bifacial Modules: Performance Simulation vs. Design Factors", IEEE 43rd Photovoltaic Specialists Conference (PVSC), Portland, Oregon, 2016, pp. 2688-2691.
Krenzinger et al., "Estimation of Radiation Incident on Bifacial Albedo-Collecting Panels", International Journal of Solar Energy, vol. 4, 1986, pp. 297-319.
Kuang et al., "A New Architecture for Transparent Electrodes: Relieving the Trade-Off Between Electrical Conductivity and Optical Transmittance", Advanced Materials, vol. 23, Apr. 29, 2011, pp. 2469-2473, doi: 10.1002/adma.201100419.

Lai et al., "Schottky Barrier Catalysis Mechanism in Metal-Assisted Chemical Etching of Silicon", ACS Applied Materials & Interfaces, Mar. 28, 2016, pp. A-E, doi: 10.1021/acsami.6b01020.
Levy et al., "Rapid and Precise Calculations of Energy and Particle Flux for Detailed-Balance Photovoltaic Applications", Solid-State Electronics, vol. 50, Jun. 30, 2006, pp. 1400-1405, doi:10.1016/j.sse.2006.06.017.
Lo et al., "New Integrated Simulation Tool for the Optimum Design of Bifacial Solar Panel with Reflectors on a Specific Site", Renewable Energy, vol. 81, Apr. 2, 2015, pp. 293-307, doi: http://dx.doi.org/10.1016/j.renene.2015.03.047.
Lohmüller et al., "The HIP-MWT+ Solar Cell Concept on N-Type Silicon and Metallization-Induced Voltage Losses", 29th European PV Solar Energy Conference and Exhibition, Amsterdam, The Netherlands, Sep. 22-26, 2014, 7 Pgs.
Lossen et al., "Double Printing nPERT Cells with Narrow Contact Layers", Energy Procedia, vol. 92, 2016, pp. 939-948, doi: 10.1016/j.egypro.2016.07.105.
Ma et al., "Enhancement of Photovoltaic Cell Response Due to High-Refractive-Index Encapsulants", Journal of Applied Physics, vol. 108, Aug. 18, 2010, pp. 043102-1-043102-3, doi: 10.1063/1.3466980.
Madrid et al., "Investigation of the Efficiency Boost Due to Spectral Concentration in a Quantum-Dot Based Luminescent Concentrator", IEEE 4th World Conference on Photovoltaic Energy Conference, 2006, pp. 154-157.
Martinez et al., "Design, Fabrication, and Characterization of a Luminescent Solar Concentrator with Optimized Optical Concentration Through Minimization of Optical Losses", Journal of Photonics for Energy, vol. 6, No. 4, Nov. 30, 2016, pp. 045504-1-045501-11, doi: 10.1117/1.JPE.6.045504.
Masuko et al., "Achievement of More Than 25% Conversion Efficiency with Crystalline Silicon Heterojunction Solar Cell", IEEE Journal of Photovoltaics, vol. 4, No. 6, Nov. 2014, pp. 1433-1435, doi: 10.1109/JPHOTOV.2014.2352151.
McIntosh et al., "OPAL 2: Rapid Optical Simulation of Silicon Solar Cells", 38th IEEE Photovoltaic Specialists Conference, Austin, Texas, 2012, 8 Pgs.
Meinardi et al., "Highly Efficient Luminescent Solar Concentrators Based on Earth-Abundant Indirect-Bandgap Silicon Quantum Dots", Nature Photonics, vol. 11, Mar. 2017, pp. 177-185, doi: 10.1038/NPHOTON.2017.
Meinardi et al., "Large-Area Luminescent Solar Concentrators Based on 'Stokes-Shift-Engineered' Nanocrystals in a Mass-Polymerized PMMA Matrix", Nature Photonics, vol. 8, Apr. 13, 2014, pp. 392-399, doi:10.1038/NPHOTON.2014.54.
Mittag et al., "Triangular Ribbons for Improved Module Efficiency", 32nd European PV Solar Energy Conference and Exhibition, Munich, Germany, Jun. 20-24, 2016, 4 Pgs.
Morales-Masis et al., "Transparent Electrodes for Efficient Optoelectronics", Advanced Electronic Materials, 2017, pp. 1600529-1-1600529-17, doi: 10.1002/alem.201600529.
Narasimhan et al., "Hybrid Metal—Semiconductor Nanostructure for Ultrahigh Optical Absorption and Low Electrical Resistance at Optoelectronic Interfaces", ACS Nano, Oct. 8, 2015, pp. A-H, doi:10.1021/acsnano.5b04034.
Needell et al., "Micro-Optical Tandem Luminescent Solar Concentrators", arXiv:1710.00034v1, Sep. 5, 2017, 10 Pgs.
Niu et al., "High Order Diffraction Suppression by Quasi-Periodic Two-Dimensional Gratings", Optical Materials Express, vol. 7, No. 2, Feb. 1, 2017, pp. 366-375, doi: http://dx.doi.org/10.1364/OME.7.000366.
Padmanabhan et al., "Light-Induced Degradation and Regeneration of Multicrystalline Silicon Al-BSF and PERC Solar Cells", Physical Status Solidi: Rapid Research Letters, Nov. 16, 2016, pp. 1-8, doi:10.1002/pssr.20160173.
Papakonstantinou et al., "Fundamental Limits of Concentration in Luminescent Solar Concentrators Revised: the Effect of Reabsorption and Nonunity Quantum Yield", Optica, vol. 2, No. 10, Oct. 2015, pp. 841-849, doi: http://dx.doi.org/10.1364/OPTICA.2.000841.

(56) References Cited

OTHER PUBLICATIONS

Papet et al., "19% Efficiency Module Based on Roth & Rau Heterojunction Solar Cells and Day4™ Energy Module Concept", 26th European Photovoltaic Solar Energy Conference and Exhibition, 2011, pp. 3336-3339.
Powell et al., "The Capital Intensity of Photovoltaics Manufacturing: Barrier to Scale and Opportunity for Innovation", Energy & Environmental Science, vol. 8, 2015, pp. 3395-3408, doi: 10.1039/c5ee01509j.
Rahman et al., "Efficient Tool Flow for 3D Photovoltaic Modelling", Computer Physics Communications, vol. 193, Mar. 30, 2015, pp. 124-130, doi: http://dx.doi.org/10.1016/j.cpc.2015.03.016.
Rau et al., "Thermodynamics of Light Management in Photovoltaic Devices", Physical Review B, vol. 90, Jul. 28, 2014, pp. 035211-1-035211-16, doi: 10.11038PhysRevB.90.035211.
Ravikumar, Dwarakanath T. "Photovoltaic Capacity Additions: The Optimal Rate of Deployment with Sensitivity to Time-Based GHG Emissions", Thesis, Arizona State University, Dec. 2013, 50 Pgs.
Reda, S. M. "Synthesis and Optical Properties of CdS Quantum Dots Embedded in Silica Matrix Thin Films and their Applications as Luminescent Solar Concentrators", Acta Materialia, vol. 56, 2008, pp. 259-264, doi:10.1016/j.actamat.2007.09.017.
Richards et al., "Overcoming the Poor Short Wavelength Spectral Response of CdS/CdTe Photovoltaic Modules via Luminescence Down-Shifting: Ray-Tracing Simulations", Progress in Photovoltaics, Research and Applications, vol. 15, 2007, pp. 27-34, doi: 10.1002/pip.723.
Rodriguez, John "Bifacial Solar Cells—the Two Sides of the Story", Solar Choice News, New Technologies, May 5, 2015, online available at <https://www.solarchoice.net.au/blog/news/bifacial-solar-cells-the-two-sides-of-the-story-050515>, 7 Pgs.
Römer et al., "Ion Implantation for Poly-Si Passivated Back-Junction Back-Contacted Solar Cells", IEEE Journal of Photovoltaics, vol. 5, No. 2, Mar. 2015, pp. 507-514, doi: 10.1109/JPHOTOV.2014.2382975.
Rowan et al., "Advanced Material Concepts for Luminescent Solar Concentrators", IEEE Journal of Selected Topics in Quantum Electronics, vol. 14, No. 5, Sep./Oct. 2008, pp. 1312-1322, doi: 10.1109/JSTQE.2008.920282.
Rowell et al., "Transparent Electrode Requirements for Thin Film Solar Cell Modules", Energy & Environmental Science, vol. 4, 2011, pp. 131-134, doi: 10.1039/c0ee00373e.
Russell et al., "The Influence of Spectral Albedo on Bifacial Solar Cells: A Theoretical and Experimental Study", IEEE Journal of Photovoltaics, vol. 7, No. 6, Nov. 2017, pp. 1611-1618, doi: 10.1109/JPHOTOV.2017.2756068.
Sahin et al., "Monte-Carlo Simulation of Light Propagation in Luminescent Solar Concentrators Based on Semiconductor Nanoparticles", Journal of Applied Physics, vol. 110, Aug. 11, 2011, pp. 03108-1-033108-8, doi: 10.1063/1.3619809.
Saive et al., "Effectively Transparent Contacts (ETCs) for Solar Cells", IEEE 43rd Photovoltaic Specialists, 2016, pp. 3612-3615, doi: 10.1109/PVSC.2016.7750346.
Saive et al., "Effectively Transparent Front Contacts for Optoelectronic Devices", Advanced Optical Materials, May 17, 2016, pp. 1-5, doi: 10.1002/adom.201600252.
Saive et al., "Enhancing the Power Output of Bifacial Solar Modules by Applying Effectively Transparent Contacts (ETCs) With Light Trapping", IEEE Journal of Photovoltaics, vol. 8, No. 5, Sep. 2018, pp. 1183-1189, doi: 10.1109/JPHOTOV.2018.2844850.
Saive et al., "Silicon Heterojunction Solar Cells with Effectively Transparent Front Contacts", Sustainable Energy & Fuels, vol. 1, 2017, pp. 593-598, doi: 10.1039/c7se00096k.
Saive et al., "Enhanced Light Trapping in Thin Silicon Solar Cells Using Effectively Transparent Contacts (ETCs)", IEEE 44th Photovoltaic Specialist Conferences, 2017, 5 Pgs.
Saive et al., "Light Trapping in Bifacial Solar Modules Using Effectively Transparent Contacts (ETCs)", IEEE 7th World Conference on Photovoltaic Energy Conversion, a Joint Conference of 45th IEEE PVSC, 28th PVSEC & 34th EU PVSEC, 2018, 3 Pgs.
Saive et al., "Mesoscale Trumps Nanoscale: Metallic Mesoscale Contact Morphology for Improved Light Trapping, optical absorption and grid conductance in silicon solar cells", Optics Express, vol. 26, No. 6, Mar. 19, 2018, pp. A275-A282, doi: https://doi.org/10.1364/OE.26.00A275.
Saive et al., "Three-Dimensional Nanoimprint Lithography Using Two-Photon Lithography Master Samples", arXiv preprint arXiv:1702.04012v1, 2017, pp. 1-4.
Saive et al., "Transparent, Conductive and Lightweight Superstrates for Perovskite Solar Cells and Modules", IEEE 7th World Conference on Photovoltaic Energy Conversion, a Joint Conference of 45th IEEE PVSC, 28th PVSEC & 34th EU PVSEC, 2018, 5 Pgs.
Sark et al., "Luminescent Solar Concentrators: The route to 10% Efficiency", IEEE 40th Photovoltaic Specialist Conference, 2014, pp. 2276-2278.
Sheldon et al., "Evaluation of ITO/GaAs Solar Cells", Journal of Vacuum Science and Technology, vol. 20, No. 3, 1982, pp. 410-413, doi: 10.1116/1.571479.
Shockley et al., "Detailed Balance Limit of Efficiency of p-n Junction Solar Cells", Journal of Applied Physics, vol. 32, No. 3, Mar. 1961, pp. 510-519.
Sholin et al., "Semiconducting Polymers and Quantum Dots in Luminescent Solar Concentrators for Solar Energy Harvesting", Journal of Applied Physics, vol. 101, Jun. 28, 2007, pp. 123114-1-123114-9, doi: 10.1063/1.2748350.
Slooff et al., "A Luminescent Solar Concentrator with 7.1% Power Conversion Efficiency", Physica Status Solid—Rapid Research Letter, vol. 2, No. 6, Sep. 26, 2008, pp. 257-259, doi 10.1002/pssr.200802186.
Söderström et al., "Smart Wire Connection Technology", Meyer Burger, 2014, 7 Pgs.
Soria et al., "A Study of the Annual Performance of Bifacial Photovoltaic Modules in the Case of Vertical Facade Integration", Energy Science & Engineering, vol. 4, No. 1, 2016, pp. 52-68, doi: 10.1002/ese3.103.
Sze et al., "Physics of Semiconductor Devices", Third Edition, Wiley-Interscience, 2007, 763 Pgs. (presented in 3 parts).
Taguchi et al., "24.7% Record Efficiency HIT Solar Cell on Thin Silicon Wafer", IEEE Journal of Photovoltaics, vol. 4, No. 1, Jan. 2014, pp. 96-99, doi 10.1109/JPHOTOV.2013.2282737.
Unknown Author, "Bifacial Photovoltaic Module, Hit Photovoltaic Module Double 195", Sanyo Energy Corporation, Jan. 9, 2008, 2 Pgs.
Unknown Author, "File: Bright Green Tree—Waikato.jpg", online available at <https://commons.wikimedia.org/wiki/File:Bright_green_tree_-_Waikato.jpg>, Dec. 9, 2005, 2 Pgs.
Unknown Author, "Levelized Cost and Levelized Avoided Cost of New Generation Resources in the Annual Energy Outlook 2016", U.S. Energy Information Administration, Aug. 2016, 20 Pgs.
Unknown Author, "Photovoltaics Report", Fraunhofer Institute for Solar Energy Systems, Freiburg, Aug. 27, 2018, 47 Pgs.
Valdivia et al., "Bifacial Photovoltaic Module Energy Yield Calculation and Analysis", IEEE 44th Photovoltaic Specialist Conference (PVSC), 2017, pp. 1094-1099.
Vogt et al., "Measurement of the Optical Constants of Soda-Lime Glasses in Dependence of Iron Content and Modeling of Iron-Related Power Losses in Crystalline Si Solar Cell Modules", IEEE Journal of Photovoltaics, vol. 6, No. 1, Jan. 2016, pp. 111-118, doi: 10.1109/JPHOTOV.2015.2498043.
Vogt et al., "Optical Constants of UV Transparent EVA and the Impact on the PV Module Output Power under Realistic Irradiation", Energy Procedia, vol. 92, 2016, pp. 523-530, doi: 10.1016/j.egypro.2016.07.136.
Vogt, Malte R. "Development of Physical Models for the Simulation of Optical Properties of Solar Cell Modules", Wilhelm Leibniz Universitaet Hannover, Thesis, 2015, 161 Pgs.
Wallentin et al., "InP Nanowire Array Solar Cells Achieving 13.8% Efficiency by Exceeding the Ray Optics Limit", Science, vol. 339, Mar. 1, 2013, pp. 1057-1060, doi: 10.1126/science.1230969.
Wang et al., "Image Quality Assessment: from Error Visibility to Structural Similarity", IEEE transactions on image processing, vol. 13, No. 4, Apr. 2004, pp. 1-14.

(56) References Cited

OTHER PUBLICATIONS

Ward et al., "High Aspect Ratio Electrodeposited Ni/Au Contacts for GaAs-Based III-V Concentrator Solar Cells", Progress in Photovoltaics: Research and Applications, vol. 23, Mar. 20, 2014, pp. 646-653, doi: 10.1002/pip.2490.

Wheeler et al., "Switchable Photovoltaic Windows Enabled by Reversible Photothermal Complex Dissociate from Methylammonium Lead Iodide", Nature Communications, vol. 8, No. 1722, 2017, pp. 1-9, doi: 10.1038/s41467-017-01842-4.

Wittwer et al., "Fluorescent Planar Concentrators", Solar Energy Materials and Solar Cells, vol. 11, 1984, pp. 187-197.

Woodhouse et al., "A Manufacturing Cost Analysis Relevant to Single- and Dual-Junction Photovoltaic Cells Fabricated with III-Vs and III-Vs Grown on Czochralski Silicon", National Renewable Energy Lab, Sep. 30, 2013, 92 Pgs.

Würfel et al., "Charge Carrier Separation in Solar Cells", IEEE Journal of Photovoltaics, vol. 5, No. 1, Jan. 1, 2015, pp. 461-469, doi: 10.1109/JPHOTOV.2014.2363550.

Xie et al., "InAs/InP/ZnSe Core/Shell/Shell Quantum Dots as Near-Infrared Emitters: Bright, Narrow-Band, Non-Cadmium Containing, and Biocompatible", Nano Research, vol. 1, Oct. 26, 2008, pp. 457-464.

Yablonovitch, Eli "Statistical Ray Optics", Journal of the Optical Society of America, vol. 72, No. 7, Jul. 1982, pp. 899-907.

Yablonovitch, Eli "Thermodynamics of the Fluorescent Planar Concentrator", Journal of the Optical Society of America, vol. 70, No. 11, Nov. 1980, pp. 1362-1363.

Yin et al., "19.2% Efficient InP Heterojunction Solar Cell with Electron-Selective TiO2 Contact", ACS Photonics, vol. 1, Sep. 25, 2014, pp. 1245-1250, doi: 10.1021/ph500153c.

Yu et al., "Selecting Tandem Partners for Silicon Solar Cells", Nature Energy, vol. 1, Nov. 2016, Article 16137, pp. 1-4, doi: 10.1038/NENERGY.2016.137.

Yusufoglu et al., "Analysis of the Annual Performance of Bifacial Modules and Optimization Methods", IEEE Journal of Photovoltaics, vol. 5, No. 1, Jan. 1, 2015, pp. 320-328, doi: 10.1109/JPHOTOV.2014.2364406.

Zheng et al., "Graphene Oxide-Based Transparent Conductive Films", Progress in Materials Science, vol. 64, Mar. 25, 2014, pp. 200-247, doi: 10.1016/j.pmatsci.2014.03.004.

Zhou et al., "Near Infrared, Highly Efficient Luminescent Solar Concentrators", Advanced Energy Materials, vol. 6, 2016, pp. 1501913-1-1501913-8, doi: 10.1002/aenm.201501913.

\* cited by examiner

SYSTEMS AND METHODS FOR NON-EPITAXIAL HIGH SCHOTTKY-BARRIER HETEROJUNCTION SOLAR CELLS

CROSS-REFERENCE TO RELATED APPLICATIONS

The current application claims the benefit of and priority under 35 U.S.C. § 119 (e) to U.S. Provisional Patent Application No. 63/038,546 entitled "High Schottky-Barrier GaAs Solar Cells" filed Jun. 12, 2020. The disclosure of U.S. Provisional Patent Application No. 63/038,546 is hereby incorporated by reference in its entirety for all purposes.

STATEMENT OF FEDERALLY SPONSORED RESEARCH

This invention was made with government support under Grant No. EEC1041895 awarded by the National Science Foundation. The government has certain rights in the invention.

FIELD OF THE INVENTION

The present invention generally relates to systems and methods for non-epitaxial heterojunction solar cells with high Schottky barriers; and more particularly to systems and methods that passivate heterojunction solar cell surfaces and make electrical contacts to them to achieve high Schottky barriers.

BACKGROUND

High-efficiency multijunction devices may use multiple bandgaps, or junctions, that are tuned to absorb a specific region of the solar spectrum to create solar cells having high efficiencies. The maximum theoretical efficiency that a single-bandgap solar cell can achieve with non-concentrated sunlight is lower, primarily because of the broad distribution of solar emitted photons. This limiting efficiency, known as the Shockley-Queisser limit, arises from the fact that the open-circuit voltage ($V_{oc}$) of a solar cell is limited by the bandgap of the absorbing material and that photons with energies below the bandgap are not absorbed. Photons that have energies greater than the bandgap are absorbed, but the energy greater than the bandgap is lost as heat.

Multijunction devices can use a high-bandgap top cell to absorb high-energy photons while allowing the lower-energy photons to pass through. A material with a slightly lower bandgap is then placed below the high-bandgap junction to absorb photons with slightly less energy (longer wavelengths). Multijunction cells can use two or more absorbing junctions, and the theoretical maximum efficiency increases with the number of junctions. Early research into multijunction devices leveraged the properties of semiconductors comprised from elements in the III and V columns of the periodic table.

Traditional multijunction III-V cells are assembled in an epitaxial monolithic stack with subcells connected in series through by tunnel junctions. Constructing a multijunction cell in a monolithic stack results in material constraints, and fabricating such devices is facilitated if the individual layers of the subcells have compatible atomic lattice positions and are lattice matched.

BRIEF SUMMARY OF THE INVENTION

Systems and methods in accordance with various embodiments of the invention enable the design and/or implementation of non-epitaxial high Schottky barriers heterojunction solar cells. In many embodiments, heterojunction solar cells include semiconductor materials from the III and V columns of the periodic table including (but not limited to): gallium arsenide (GaAs). Several embodiments include n-type doped GaAs solar cells (n-GaAs) and p-type doped GaAs solar cells (p-GaAs). Heterojunction solar cells in accordance with many embodiments are formed using non-epitaxial methods. Several embodiments provide that non-epitaxial heterojunction solar cells reduce fabrication costs and improve scalability.

Some embodiments passivate heterojunction solar cell surfaces and also make electrical contacts to them to achieve high Schottky barriers. Several embodiments provide that the passivation layers can include organic layers. In some embodiments, layers with bulky tails can be deposited on top of the passivation layers to protect the passivation layers and the solar cell surfaces. Certain embodiments provide that the bulky tails are sufficiently short so that electrons and/or holes can pass through. In a number of embodiments, transparent conductor layers can be deposited on top of the bulky tail layers. In many embodiments, open-circuit voltage ($V_{oc}$) of high Schottky barrier heterojunction solar cells can range from about 20 mV to about 900 mV. The efficiency of the heterojunction solar cells in accordance with several embodiments is at least 20%.

One embodiment of the invention includes a non-epitaxial heterojunction solar cell, comprising at least one back contact; at least one semiconductor substrate, where the semiconductor is an n-type doped GaAs or a p-type doped GaAs; at least one passivation layer, wherein the passivation layer passivates one surface of the semiconductor substrate; at least one contact layer, wherein the contact layer is a hole transport layer or an electron transport layer, and the contact layer is on top of the passivation layer; and at least one electrode modified layer, wherein the electrode modified layer is on top of the contact layer.

In another embodiment, the back contact is an ohmic contact comprising Cu and Ge.

In a further embodiment, the passivation layer is an organic film comprising at least one thiol group.

In still another embodiment, the organic film comprises octanethiol (OT), 3,3,4,4,5,5,6,6,7,7,8,8,8-tridecafluoro-1-octanethiol (FOT), pentafluorothiophenol (PFBT), dithiothreitol (DTT), or cysteine (Cys).

In a yet further embodiment, the passivation layer is an organic film comprising N-heterocyclic-carbene.

In yet another embodiment, the organic film comprises 1,3-Diisopropylimidazolium Hydrogencarbonate (NHC).

In a still further embodiment, the passivation layer comprises at least one sulfide ion.

In yet another embodiment, the passivation layer comprises ammonium sulfide.

In a further embodiment again, the hole transport layer comprises one of poly(3,4-ethylenedioxythiophene) polystyrene sulfonate (PEDOT:PSS), 2,2',7,7'-Tetrakis[N,N-di(4-methoxyphenyl)amino]-9,9'-spirobifluorene (SPIRO), SPIRO doped with 5 wt % Tris(pentafluorophenyl)borane, tris(4-carbazoyl-9-ylphenyl)amine (TCTA), TCTA doped with 5 wt % Tris(pentafluorophenyl)borane, polystyrene (PS), 4,4'-Bis(N-carbazolyl)-1,1'-biphenyl (CBP), copper (1) iodide (CuI) dissolved in acetonitrile, polyvinyl alcohol (PVA), copper thiocyanate (CuSCN), 1,1-Bis[(di-4-tolylamino)phenyl]cyclohexane (TAPC), TAPC doped with 5 wt % Tris(pentafluorophenyl)borane, poly(triaryl amine) (PTAA), PTAA doped with 5 wt % Tris(pentafluorophenyl) borane, nickel oxide (NiO) nanoparticles, or NiO film.

In a further embodiment again, the electron transport layer comprises one of tin oxide ($SnO_2$) nanoparticles, aluminum doped zinc oxide (AZO) nanoparticles, or C60.

In a still yet further embodiment, the semiconductor substrate is an n-type doped GaAs and the electrode modified layer comprises tungsten trioxide ($WO_3$) or molybdenum trioxide ($MoO_3$).

In another additional embodiment, the semiconductor substrate is an p-type doped GaAs and the electrode modified layer comprises lithium fluoride (LiF) or caesium oxide ($Cs_2O$).

A still further embodiment includes a lateral current transport layer, where the lateral current transport layer comprises poly(3,4-ethylenedioxythiophene) polystyrene sulfonate (PEDOT:PSS), indium tin oxide (ITO), or silver nanowires.

In a still yet further embodiment, the open circuit voltage of the solar cell is at least 830 mV.

Still another additional embodiment includes a method of fabricating a non-epitaxial heterojunction solar cell comprising: providing a semiconductor substrate, wherein the semiconductor substrate does not have any epitaxial layers; depositing a back contact layer on a first side of the semiconductor substrate; passivating a second side of the semiconductor substrate with at least one passivation layer; coating the passivation layer with at least one contact layer, wherein the contact layer is a hole transport layer or an electron transport layer; and depositing at least one electrode modified layer on the contact layer.

In a further embodiment again, the semiconductor substrate is an n-type doped GaAs or a p-type doped GaAs.

In yet another embodiment, the back contact is an ohmic contact comprising Cu and Ge and the back contact is deposited by thermal evaporation.

In a still further additional embodiment, the passivation layer is an organic film comprising at least one thiol group and the organic film comprises octanethiol (OT), 3,3,4,4,5,5,6,6,7,7,8,8,8-tridecafluoro-1-octanethiol (FOT), pentafluorothiophenol (PFBT), dithiothreitol (DTT), or cysteine (Cys).

In another yet further embodiment, the passivation layer is an organic film comprising N-heterocyclic-carbene and the organic film comprises 1,3-Diisopropylimidazolium Hydrogencarbonate (NHC).

In yet another embodiment again, the passivation layer comprises ammonium sulfide.

In still yet another further embodiment, the hole transport layer comprises one of poly(3,4-ethylenedioxythiophene) polystyrene sulfonate (PEDOT:PSS), 2,2',7,7'-Tetrakis[N,N-di(4-methoxyphenyl)amino]-9,9'-spirobifluorene (SPIRO), SPIRO doped with 5 wt % Tris(pentafluorophenyl)borane, tris(4-carbazoyl-9-ylphenyl)amine (TCTA), TCTA doped with 5 wt % Tris(pentafluorophenyl)borane, polystyrene (PS), 4,4'-Bis(N-carbazolyl)-1,1'-biphenyl (CBP), copper (1) iodide (CuI) dissolved in acetonitrile, polyvinyl alcohol (PVA), copper thiocyanate (CuSCN), 1,1-Bis[(di-4-tolylamino)phenyl]cyclohexane (TAPC), TAPC doped with 5 wt % Tris(pentafluorophenyl)borane, poly(triaryl amine) (PTAA), PTAA doped with 5 wt % Tris(pentafluorophenyl) borane, nickel oxide (NiO) nanoparticles, or NiO film.

In still another further embodiment again, the electron transport layer comprises one of tin oxide ($SnO_2$) nanoparticles, aluminum doped zinc oxide (AZO) nanoparticles, or C60.

In another further additional embodiment, the semiconductor substrate is an n-type doped GaAs and the electrode modified layer comprises tungsten trioxide ($WO_3$) or molybdenum trioxide ($MoO_3$).

In yet a further embodiment again, the semiconductor substrate is an p-type doped GaAs and the electrode modified layer comprises lithium fluoride (LiF) or caesium oxide ($Cs_2O$).

A still further embodiment again includes depositing a lateral current transport layer on the electrode modified layer, wherein the lateral current transport layer comprises poly(3,4-ethylenedioxythiophene) polystyrene sulfonate (PEDOT:PSS), indium tin oxide (ITO), or silver nanowires.

Additional embodiments and features are set forth in part in the description that follows, and in part will become apparent to those skilled in the art upon examination of the specification or may be learned by the practice of the disclosure. A further understanding of the nature and advantages of the present disclosure may be realized by reference to the remaining portions of the specification and the drawings, which forms a part of this disclosure

BRIEF DESCRIPTION OF THE DRAWINGS

The description will be more fully understood with reference to the following figures, which are presented as exemplary embodiments of the invention and should not be construed as a complete recitation of the scope of the invention, wherein.

DETAILED DESCRIPTION OF THE INVENTION

Figure 1:
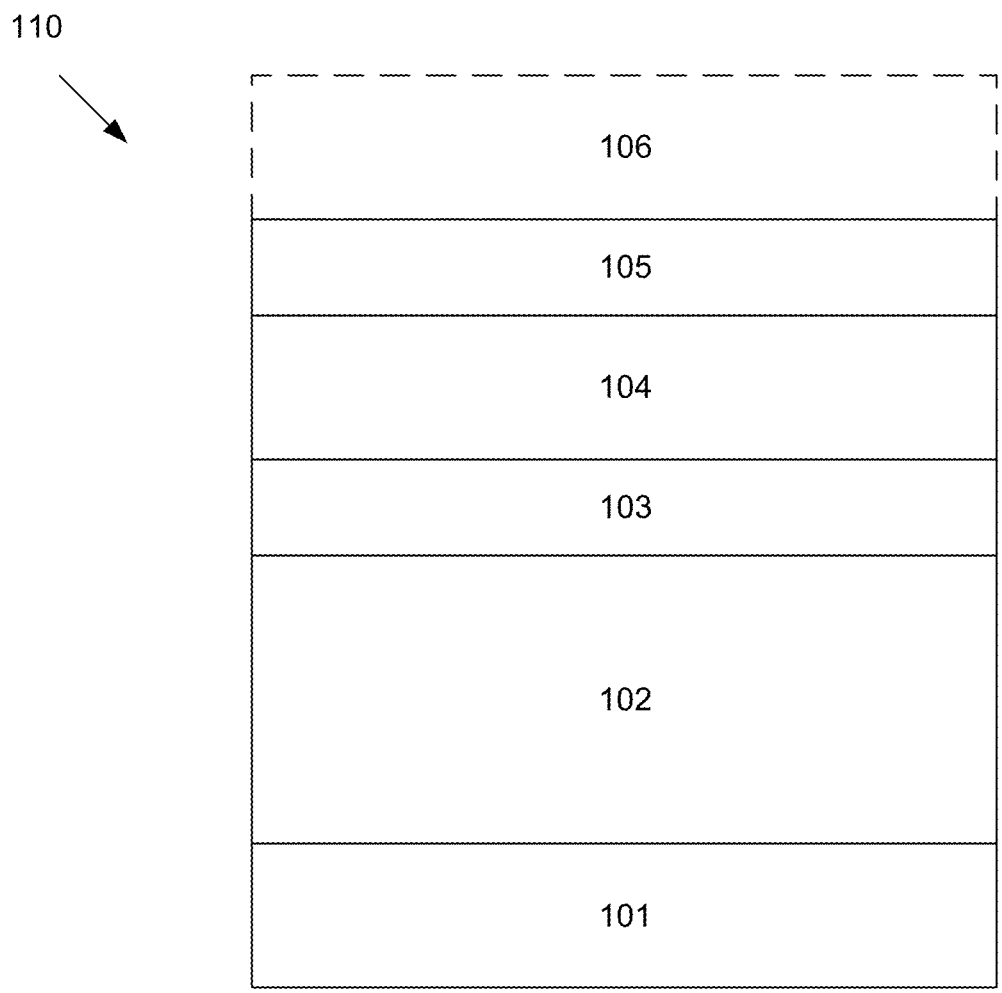
FIG. 1 illustrates a non-epitaxial heterojunction solar cell structure in accordance with an embodiment of the invention.

Turning now to the drawings, non-epitaxial heterojunction solar cells with high Schottky barriers in accordance with various embodiments are illustrated. Many embodiments implement heterojunction solar cells with semiconductor materials from the III and V groups of the periodic table. Semiconductor materials of heterojunction solar cells include (but are not limited to): gallium arsenide (GaAs). Several embodiments include n-type doped GaAs solar cells (n-GaAs) and p-type doped GaAs solar cells (p-GaAs). Heterojunction solar cells in accordance with many embodiments are formed without any epitaxial processing. Some embodiments provide that heterojunction solar cells are formed without external doping on a bulk wafer. Several embodiments provide that non-epitaxial heterojunction solar cells reduce fabrication costs and improve scalability.

Many embodiments provide non-epitaxial processes to form high Schottky barrier solar cells. Some embodiments passivate heterojunction solar cell surfaces and also make electrical contacts to them to achieve high Schottky barriers. Several embodiments provide that the passivation layers can include organic layers. In certain embodiments, the organic layers can bond to the solar cell surfaces and passivate them. In some embodiments, the passivation layers can be organic layers containing at least one thiol group. The thiol containing passivation layers can make high-barrier Schottky junctions in accordance with many embodiments. Several embodiments provide that the passivation layers can be organic layers containing N-heterocyclic-carbene. The passivation layers in accordance with certain embodiments can be organic layers containing sulfide ions including (but not limited to) ammonium sulfide.

In some embodiments, electron and/or hole transport contacts can be deposited on top of the passivation layers to protect the passivation layers and the solar cell surfaces. In several embodiments, the electron/hole contact layers contain bulky tails with a certain length so that electrons and/or holes can pass through. Certain embodiments provide that electron and/or hole transport contact layers should not destroy the semiconductor and the passivation layer interface. In a number of embodiments, electron and/or hole transport contacts can be solution deposited nanoparticles, solution deposited organics, evaporated metal oxides, and organics. Some embodiments provide that the organics may allow deposition of metals to make high-barrier Schottky contacts.

In a number of embodiments, electrode modified layers can be deposited on top of electron/hole transport layers. The electrode modified layers in accordance with several embodiments can set the work function of the contacts. Examples of the electrode modified layers for n-GaAs include (but are not limited to): tungsten trioxide ($WO_3$), molybdenum trioxide ($MoO_3$). Examples of electrode modified layers for p-GaAs include (but are not limited to): lithium fluoride (LiF), caesium oxide ($Cs_2O$).

In several embodiments, lateral current transport layers can be deposited on top of the contacts. The lateral current transport layers in accordance with some embodiments can be transparent conductors. Examples of lateral current transport layers include (but are not limited to): poly(3,4-ethylenedioxythiophene) polystyrene sulfonate (PEDOT:PSS), indium tin oxide (ITO), silver nanowires.

Many embodiments provide that open-circuit voltage ($V_{oc}$) of high Schottky barrier heterojunction solar cells can range from about 20 mV to about 900 mV. In some embodiments, $V_{oc}$ can be about 830 mV. The efficiency of the heterojunction solar cells in accordance with several embodiments can be about 20%.

Heterojunction Solar Cells

The levelized cost of energy of novel photovoltaic technology may need to be competitive with silicon and other power generation technologies in order to compete with silicon and contribute to fighting global warming. In order to grow quickly from pilot-plant scale to mass-manufacturing it may be necessary that the novel technology have a low capital intensity so that profit from selling devices can be quickly converted into new factories to manufacture devices. The capital intensity of silicon photovoltaics can be dominated by converting sand into semiconductor-grade wafers which may suggest two strategies for achieving high growth-rates. First, avoid using wafers. This is the strategy explored by perovskites, CdTe, CIGS, and organic photovoltaics which implement non-epitaxial heterojunction devices. (See, e.g., Q. Jiang, et al., *Nat. Photonics*, 2019, 13, 7, 460-466; L. Meng, et al., *Science*, 2018, 361, 6407, 1094-1098; the disclosures of which are incorporated herein by references.)

A second and less explored strategy for reducing capital intensity is to convert one wafer of semiconductor into a large number of solar cells, thus splitting the capital cost of the wafer over a large number of devices. This strategy may not be viable for silicon because by being an indirect bandgap semiconductor it can require a whole wafer of material to efficiently absorb sunlight. But, for the direct bandgap III-V semiconductors such as GaAs and InP that do strongly absorb sunlight, this may be a viable strategy. Previous work has been done on making GaAs and InP solar cells with 'thin' active layers by using techniques such as epitaxial-liftoff, controlled mechanical spalling, and nanowire-on-wafer. (See, e.g., G. J. Bauhuis, et al., *Sol. Energy Mater. Sol. Cells*, 2009, 93, 9, 1488-1491; E. Yablonovitch, et al., *Appl. Phys. Left.*, 1990, 56, 24, 2419-2421; the disclosures of which are incorporated herein by references.) However, the active layers of these films are always grown epitaxially, whose enormous capital intensity preclude their mass-manufacture. (See, e.g., A. Goodrich, et al., *A Manufacturing Cost Analysis Relevant to Single-and Dual-Junction Photovoltaic Cells Fabricated with III-Vs and III-Vs Grown on Czochralski Silicon*, 2013; the disclosure of which is incorporated herein by reference.)

Previous work has focused on non-epitaxial GaAs heterostructures, using PEDOT:PSS and graphene for charge collection, however the largest $V_{oc}$ reported for an ungated device is 780 mV. (See, e.g., L. Yan, et al., *Org. Electron*, 2015, 16, 71-76; K. Y. Cheng, et al., *IEEE 40$^{th}$ Photovoltaic Specialist Conference, PVSC,* 2014, 1519-1521; X. Li, et al., *Nano Energy,* 2015, 16, 310-319; the disclosures of which are incorporated herein by references.) The wafer-free photovoltaic research has identified easy-to-use charge transport layers and proposed using these layers for charge transport on III-V thin films produced using low-cost techniques such as spalling and nanostructure exfoliation.

Many embodiments provide heterojunction solar cells with high $V_{oc}$ that are fabricated with non-epitaxial methods. Several embodiments implement III-V semiconductors including (but not limited to): n-type doped GaAs and p-type doped GaAs in the heterojunction solar cells. Some embodiments provide a simple, robust, and residue-free GaAs passivation process that results in a heterostructure-grade surface. A number of embodiments provide process conditions for depositing a heterojunction that does not degrade the GaAs surface. Certain embodiments provide GaAs/organic hybrid heterojunction solar cells with $V_{oc}$ of at least 830 mV without epitaxial processing or external doping on a bulk wafer. In some embodiments, the heterojunction solar cells have an area of about 10 $mm^2$.

Non-Epitaxial Heterojunction Solar Cell

Many embodiments implement heterojunction including III-V semiconductors solar cells fabricated with non-epitaxial processes. Several embodiments implement passivation processes to create heterostructure-grade surface on the semiconductor substrates. Some embodiments provide electrical contacts to the semiconductor substrates by depositing charge carrier transport layers. FIG. 1 illustrate the structure of a heterojunction solar cell in accordance with an embodiment of the invention. Many embodiments implement heterojunction solar cells (110) with III-V semiconductor materials. Semiconductor materials provide the substrates (102) of heterojunction solar cells. Examples of semiconductor materials include (but are not limited to): n-type doped GaAs (n-GaAs) and p-type doped GaAs (p-GaAs). Some embodiments implement copper, silver, and/or gold as electrodes of the solar cells. The copper and/or silver electrodes can be prepared by thermal evaporation to achieve about 20 nm in thickness. As can readily be appreciated, any of a variety of semiconductor substrates can be utilized as appropriate to the requirements of specific applications in accordance with various embodiments.

In many embodiments, the semiconductor substrates can have back contacts (101) deposited on the back side of the substrates. The back contacts form Ohmic contact with the semiconductor. Examples of back contacts include (but are not limited to): copper, silver, gold, and germanium. As can readily be appreciated, any of a variety of electrodes can be utilized as appropriate to the requirements of specific applications in accordance with various embodiments.

Many embodiments provide non-epitaxial processes to form high Schottky barrier solar cells. Some embodiments passivate heterojunction solar cell surfaces and also make electrical contacts to them to achieve high Schottky barriers. Several embodiments provide that the passivation layers (103) can include organic layers that can bond to the solar cell surfaces and passivate them. In some embodiments, the passivation layers can be organic layers containing at least one thiol group. Examples of thiol containing organic layers include (but are not limited to): octanethiol (OT), 3,3,4,4,5,5,6,6,7,7,8,8-tridecafluoro-1-octanethiol (FOT), pentafluorothiophenol (PFBT). The thiol group containing organic layers in accordance with some embodiments can be dissolved in about 5 mL of ethanol and ammonia water mixture (4 parts ethanol and 1-part ammonia water) for about an hour and then rinsed in methanol or isopropyl alcohol (IPA) to passivate the semiconductor substrates.

Several embodiments provide that the passivation layers (103) can be organic layers containing N-heterocyclic-carbene. Examples of N-heterocyclic-carbene containing organic layers include (but are not limited to): 1,3-Diisopropylimidazolium Hydrogencarbonate (NHC). In some embodiments, the N-heterocyclic-carbene containing passivation layers can be formed by mixing NHC with about 50 mg of 1,3-Diisopropylimidazolium Hydrogencarbonate in about 5 mL of 7N ammonia in methanol for about 5 minutes and then rinsed in methanol or IPA.

The passivation layers (103) in accordance with certain embodiments can be organic layers containing sulfide ions including (but not limited to) ammonium sulfide. Several embodiments provide that equal volume mixture of ammonium sulfide, ammonia water, and hydrazine monohydrate can be mixed with about 5 wt % elemental sulfur at 50° C. for one minute then rinsed under ID water to form the passivation layers.

In a number of embodiments, the passivation layers (103) can include dithiothreitol (DTT), and cysteine (Cys). In many embodiments, about 50 mg of cysteine or dithiothreitol can be dissolved in about 5 mL of ethanol and ammonia water mixture (4 parts ethanol and 1-part ammonia water) for about an hour and then rinsed in methanol or IPA to form the passivation layers. As can readily be appreciated, any of a variety of passivation layers can be utilized as appropriate to the requirements of specific applications in accordance with various embodiments.

In some embodiments, electron and/or hole transport contacts (104) can be deposited on top of the passivation layers to protect the passivation layers and the solar cell surfaces. In several embodiments, the electron/hole contact layers contain bulky tails with a certain length so that electrons and/or holes can pass through. Certain embodiments provide that electron and/or hole transport contact layers should not destroy the semiconductor and the passivation layer interface. In a number of embodiments, electron and/or hole transport contacts can be solution deposited nanoparticles, solution deposited organics, evaporated metal oxides, and organics. Some embodiments provide that the organics may allow deposition of metals to make high-barrier Schottky contacts.

Several embodiments provide that hole transport layers (104) can include (but are not limited to): poly(3,4-ethylenedioxythiophene) polystyrene sulfonate (PEDOT:PSS), 2,2',7,7'-Tetrakis[N,N-di(4-methoxyphenyl)amino]-9,9'-spirobifluorene (SPIRO), SPIRO doped with 5 wt % Tris(pentafluorophenyl)borane, tris(4-carbazoyl-9-ylphenyl)amine (TCTA), TCTA doped with 5 wt % Tris(pentafluorophenyl)borane, polystyrene (PS), 4,4'-Bis(N-carbazolyl)-1,1'-biphenyl (CBP), copper (1) iodide (CuI) dissolved in acetonitrile, polyvinyl alcohol (PVA) dissolved in water, copper thiocyanate dissolved in ammonia water (CuSCN), 1,1-Bis[(di-4-tolylamino)phenyl]cyclohexane (TAPC), TAPC doped with 5 wt % Tris(pentafluorophenyl)borane, poly(triaryl amine) (PTAA), PTAA doped with 5 wt % Tris(pentafluorophenyl)borane, nickel oxide (NiO) nanoparticles, NiO by electron beam evaporation deposition. In some embodiments, the PEDOT:PSS hole transport layer can be mixed with about 10 wt % DMSO and spun coat at about 3000 rpm for about 30 seconds, then baked on a hot plate at about 130° C. for about 5 minutes. Certain embodiments provide that organic hole transport layers can be dissolved in chlorobenzene and then spun coat to achieve about 10 nm in thickness. Electron beam evaporation deposited NiO layers in accordance with certain embodiments can be prepared by electron beam evaporation of nickel with oxygen at a pressure of about 5E-5 Torr. As can readily be appreciated, any of a variety of hole transport layers can be utilized as appropriate to the requirements of specific applications in accordance with various embodiments.

Electron transport layers (104) in accordance with many embodiments can include (but are not limited to): tin oxide ($SnO_2$) nanoparticles, aluminum doped zinc oxide (AZO) nanoparticles, C60 (buckyballs). In several embodiments, nanoparticles layers can be prepared from nanoparticle dispersions from Avantama®. In some embodiments, C60 layers can be prepared by thermal evaporation to achieve about 10 nm in thickness. As can readily be appreciated, any of a variety of electron transport layers can be utilized as appropriate to the requirements of specific applications in accordance with various embodiments.

In a number of embodiments, electrode modified layers (105) can be deposited on top of electron/hole transport layers. The electrode modified layers in accordance with several embodiments can set the work function of the contacts. Examples of the electrode modified layers for n-GaAs include (but are not limited to): tungsten trioxide ($WO_3$), molybdenum trioxide ($MoO_3$). Examples of electrode modified layers for p-GaAs include (but are not limited to): lithium fluoride (LiF), caesium oxide ($Cs_2O$). As can readily be appreciated, any of a variety of electrode modified layers can be utilized as appropriate to the requirements of specific applications in accordance with various embodiments.

In several embodiments, lateral current transport layers (106) can be deposited on top of the contacts. The lateral current transport layers in accordance with some embodiments can be transparent conductors. Examples of transparent conducting layers include (but are not limited to): poly(3,4-ethylenedioxythiophene) polystyrene sulfonate (PEDOT:PSS), indium tin oxide (ITO). Certain embodiments include silver nanowires in the lateral transport layers. The lateral current transport layers can be optional. As can readily be appreciated, any of a variety of lateral current transport layers can be utilized as appropriate to the requirements of specific applications in accordance with various embodiments.

Many embodiments provide that open-circuit voltage ($V_{oc}$) of high Schottky barrier heterojunction solar cells can range from about 20 mV to about 900 mV. In some embodiments, $V_{oc}$ can be about 830 mV. The efficiency of the heterojunction solar cells in accordance with several embodiments can be at least 20%. Table 1 lists $V_{oc}$ of n-GaAs organic heterojunction solar cells with various combinations of passivation layers, hole transport layers (HTL), electron transport layers (ETL), and electrode modifier layers.

TABLE 1

$V_{oc}$ of n-GaAs heterojunction solar cells with different passivation layers, HTL, ETL, and electrode modifier layers.

| Passivant | HTL | ETL | Electrode Modifier | $V_{oc}$, mV |
|---|---|---|---|---|
| OT | | AZO NP | | 20 |
| NHC | CBP | | MoO$_3$ | 115 |
| DTT | CuI | | MoO$_3$ | 120 |
| DTT | TCTA Doped | | MoO$_3$ | 154 |
| DTT | TAPC | | MoO$_3$ | 172 |
| DTT | TAPC Doped | | MoO$_3$ | 176 |
| NHC | PS | | MoO$_3$ | 205 |
| DTT | CBP | | MoO$_3$ | 244 |
| NHC | TCTA Doped | | MoO$_3$ | 269 |
| OT | | SnO$_2$ NP | | 281 |
| DTT | CuSCN | | MoO$_3$ | 305 |
| NHC | CuSCN | | MoO$_3$ | 312 |
| OT | | NiO EB | | 316 |
| DTT | PTAA Doped | | MoO$_3$ | 327 |
| NHC | TAPC | | MoO$_3$ | 337 |
| NHC | TAPC | | MoO$_3$ | 337 |
| NHC | TCTA | | MoO$_3$ | 340 |
| NHC | TAPC Doped | | MoO$_3$ | 340 |
| NHC | NONE | | MoO$_3$ | 342 |
| Sulfide | NiO EB | | | 363 |
| DTT | | | MoO$_3$ | 386 |
| DTT | PS | | MoO$_3$ | 389 |
| DTT | NiO NP | | MoO$_3$ | 390 |
| NHC | PTAA Doped | | MoO$_3$ | 395 |
| OT | | | MoO$_3$ | 404 |
| Cys | | | MoO$_3$ | 405 |
| DTT | PS | | MoO$_3$ | 451 |
| FOT | NiO NP | | MoO$_3$ | 458 |
| OT | | C60 | | 468 |
| DTT | TCTA | | MoO$_3$ | 492 |
| Sulfide | TCTA | | WO$_3$ | 511 |
| DTT | PVA | | MoO$_3$ | 521 |
| FOT | TCTA | | MoO$_3$ | 523 |
| FOT | NONE | | MoO$_3$ | 545 |
| NHC | CBP | | MoO$_3$ | 560 |
| Sulfide | PVA | | MoO$_3$ | 588 |
| DTT | PEDOT | | MoO$_3$ | 594 |
| Sulfide | TAPC | | MoO$_3$ | 602 |
| NHC | PS | | MoO$_3$ | 609 |
| OT | NiO NP | | | 610 |
| DTT | TCTA | | MoO$_3$ | 611 |
| Sulfide | TCTA Doped | | MoO$_3$ | 620 |
| FOT | PVA | | MoO$_3$ | 621 |
| Sulfide | PS | | MoO$_3$ | 622 |
| Sulfide | TAPC Doped | | MoO$_3$ | 632 |
| PFBT | NONE | | MoO$_3$ | 634 |
| PFBT | CuSCN | | MoO$_3$ | 639 |
| Sulfide | TCTA | | MoO$_3$ | 664 |
| DTT | PTAA | | MoO$_3$ | 670 |
| Sulfide | SPIRO Doped | | MoO$_3$ | 670 |
| PFBT | TCTA | | MoO$_3$ | 682 |
| Sulfide | SPIRO | | MoO$_3$ | 685 |
| Sulfide | PEDOT | | | 719 |
| DTT | PS | | MoO$_3$ | 721 |
| Sulfide | PTAA Doped | | MoO$_3$ | 725 |
| Sulfide | PTAA | | MoO$_3$ | 731 |
| Sulfide | NiO NP | | | 747 |
| PTAA | | | MoO$_3$ | 752 |
| Sulfide | SPIRO | | | 773 |
| Sulfide | NiO NP | | WO$_3$ | 793 |
| Sulfide | TCTA | | WO$_3$ | 842 |

GaAs/TCTA/WO$_3$ Heterojunction Solar Cells

Figure 2:
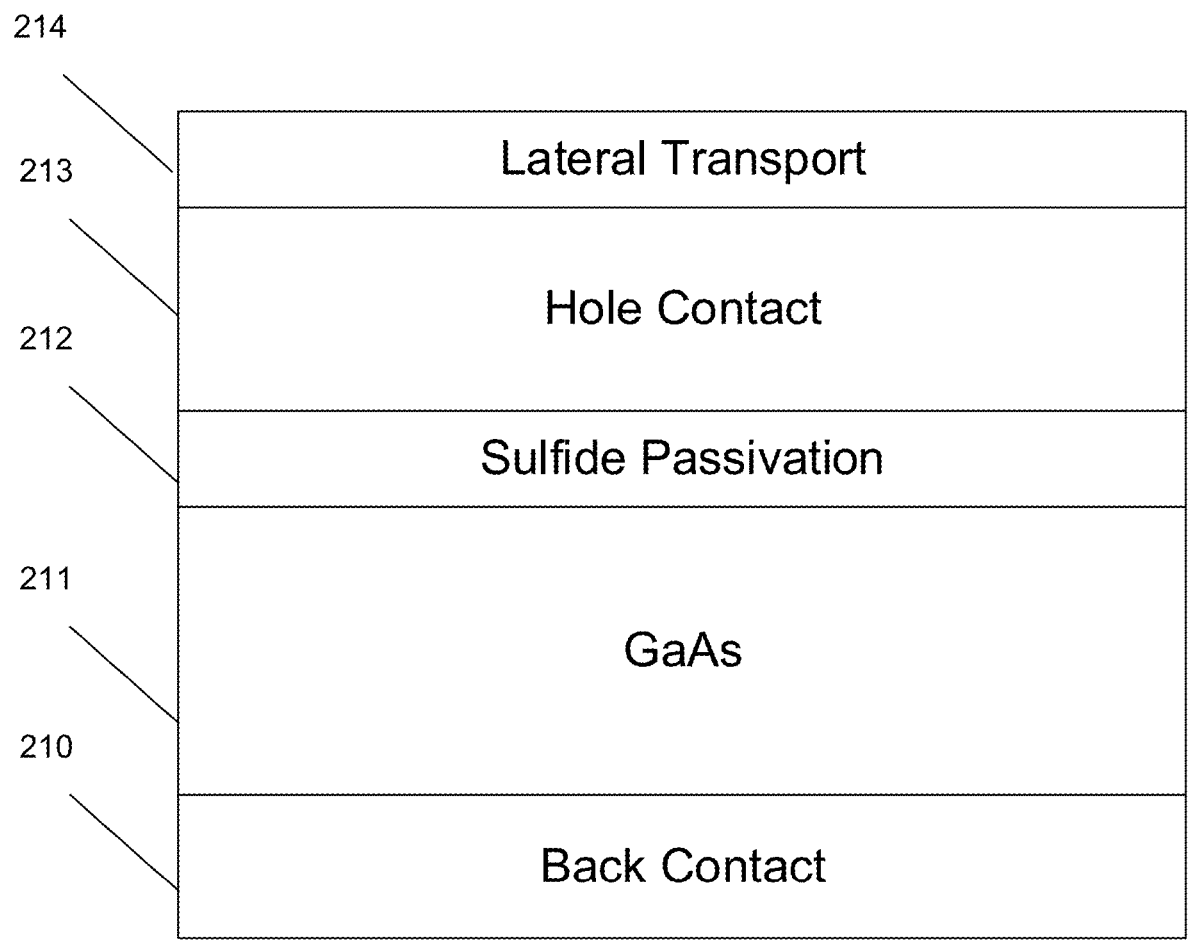
FIG. 2 illustrates a GaAs/TCTA/$WO_3$ heterojunction solar cell structure in accordance with an embodiment of the invention.

Many embodiments provide GaAs heterojunction solar cells that can achieve high $V_{oc}$ without any epitaxial processing or external doping on a bulk wafer. In some embodiments, the GaAs heterojunction solar cells have an area of about 10 mm$^2$. Several embodiments provide the effect of various thickness of hole selective contact layers including (but not limited to) TCTA on device performance. A structure of GaAs/TCTA/WO$_3$ heterojunction solar cell in accordance with an embodiment of the invention is illustrated in FIG. 2. The semiconductor GaAs substrate (211) can be a n-type GaAs with about 5E17 doping density. The GaAs substrate can be about 500 µm in thickness. On the backside of the GaAs substrate, a back contact (210) can be deposited. The back contact can be a CuGe Ohmic contact. On the top side of the GaAs substrate, a passivation layer (212) can be deposited to passivate the semiconductor surface. The passivation can be a sulfide passivated layer of GaS monolayer. A hole selective contact layer (213) that transports hole charge carriers can be coated on the passivation layer. The hole selective layers can be TATA with variable thickness from about 5 nm to about 30 nm. An electrode modified layer (not shown) can be deposited on the hole contact layer to set the work function. The electrode modified layer can be a WO$_3$ film of about 5 nm in thickness. A lateral transport layer (214) including (but not limited to): PEDOT:PSS, can be deposited to improve charge transport.

Figure 3A:
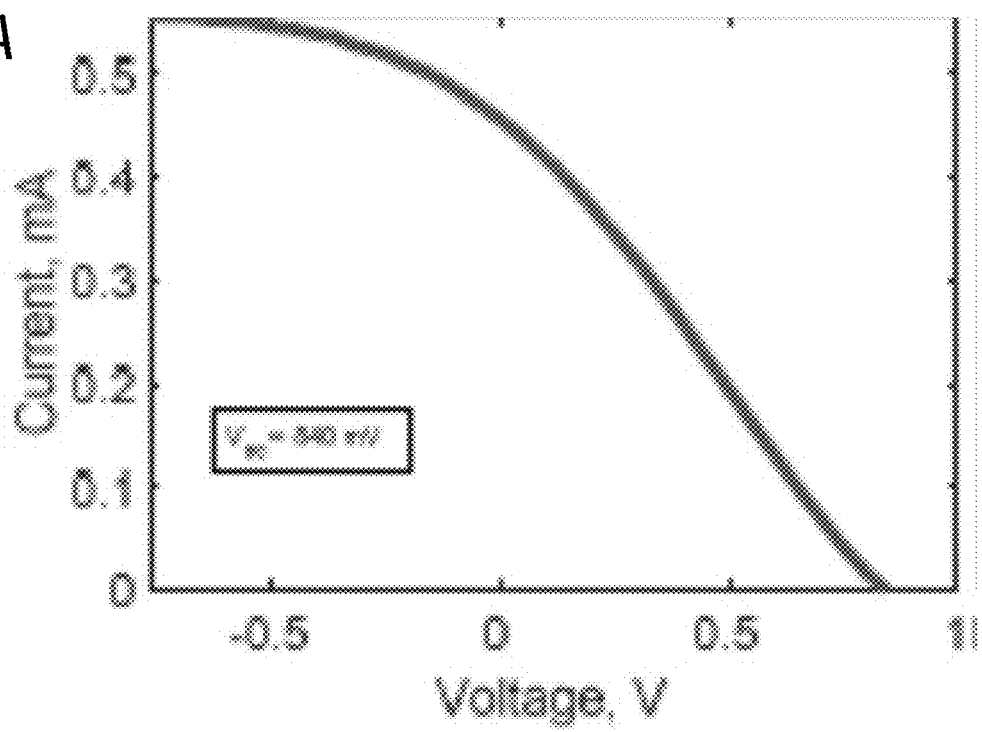
FIGS. 3A and 3B illustrate IV curves of GaAs/TCTA/$WO_3$ heterojunction solar cell with different TCTA thickness in accordance with an embodiment of the invention.
Figure 3B:
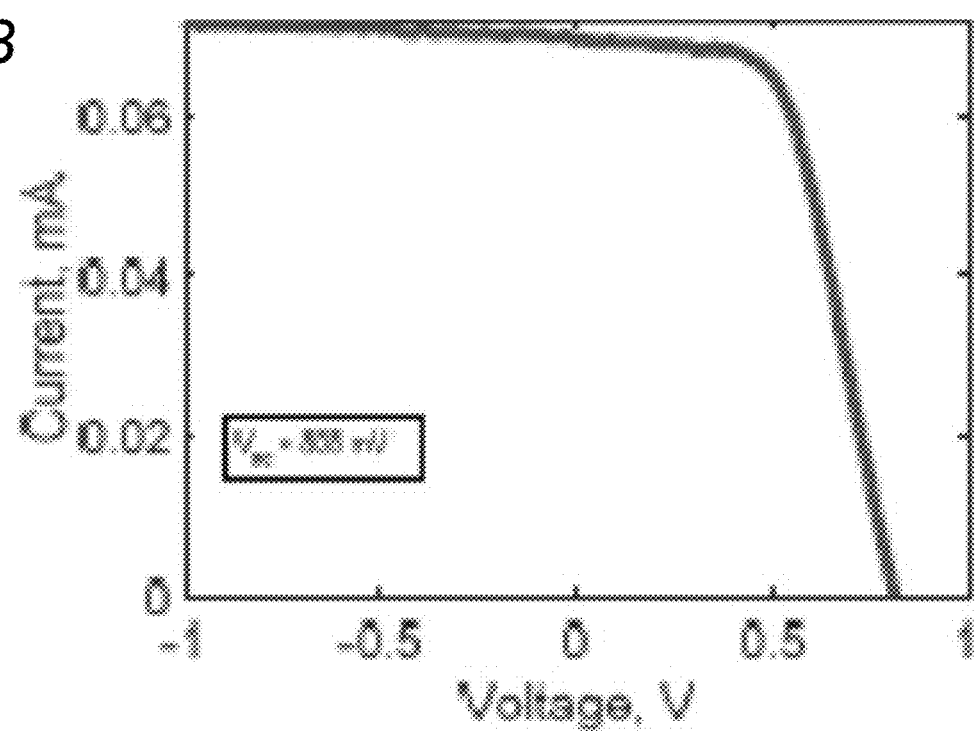

The solar cell with a thinner TCTA hole contact achieves a higher $V_{oc}$ in accordance with many embodiments. IV curves of GaAs/TCTA/WO$_3$/PEDOT:PSS heterojunction solar cell with TCTA at 5 nm and 30 nm thickness in accordance with an embodiment are illustrated in FIGS. 3A and 3B respectively. FIG. 3A shows the IV curve of the solar cell with a Cu/Ge Ohmic back contact, a 500 µm n-GaAs substrate, a sulfide passivated GaS monolayer, a 5 nm TCTA, a 5 nm WO$_3$, and a PEDOT:PSS lateral transport layer. The device has $V_{oc}$ of about 840 mV. FIG. 3B shows the IV curve of the solar cell with a Cu/Ge Ohmic back contact, a 500 µm n-GaAs substrate, a sulfide passivated GaS monolayer, a 30 nm TCTA, a 5 nm WO$_3$, and a PEDOT:PSS lateral transport layer. The device has $V_{oc}$ of about 806 mV.

Figure 4:
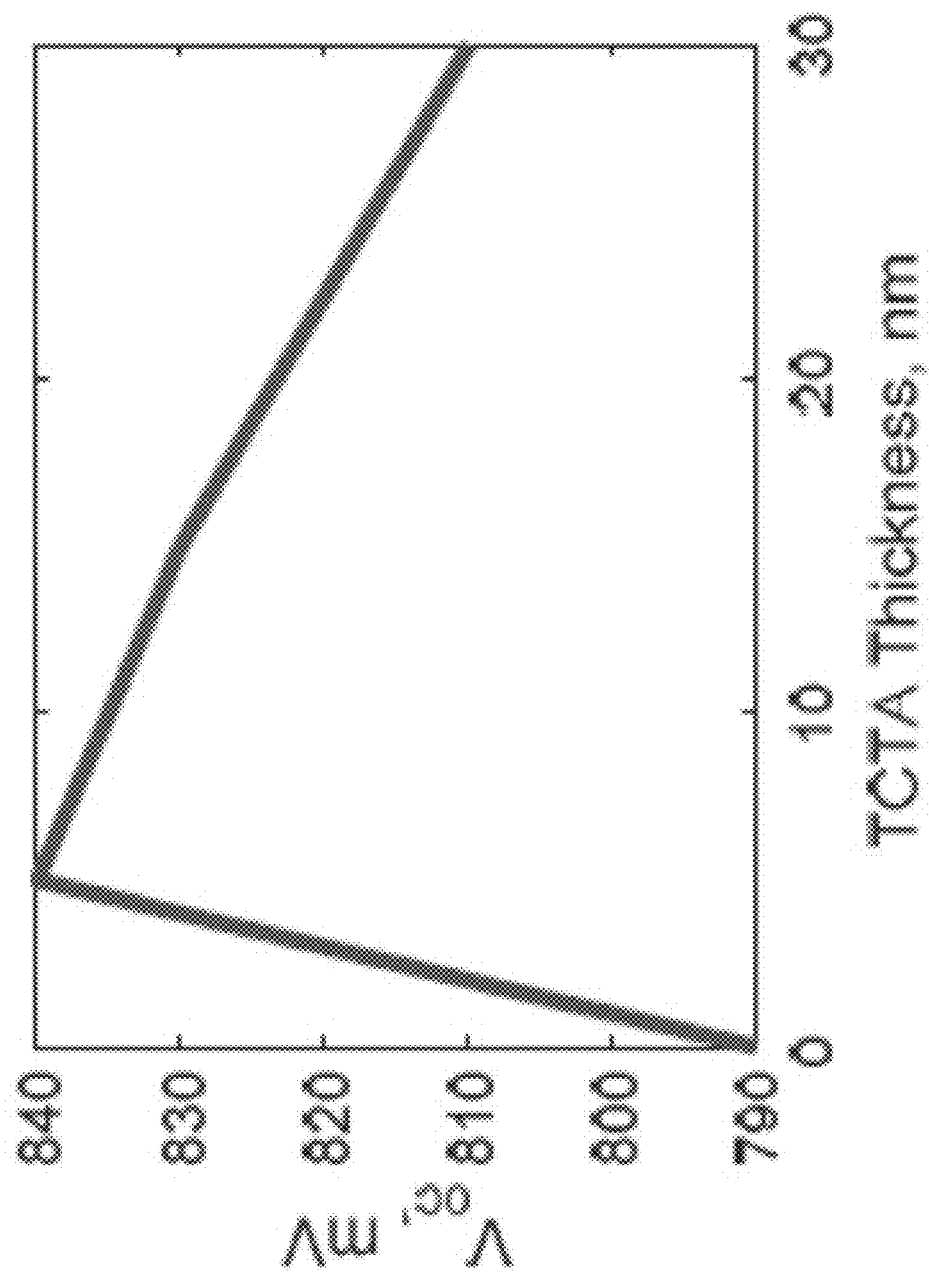
FIG. 4 illustrates $V_{oc}$ of GaAs/TCTA/$WO_3$ heterojunction solar cells with various TCTA thickness in accordance with an embodiment of the invention.

Several embodiments provide an optimal TCTA thickness that can achieve a highest $V_{oc}$ in GaAs/TCTA/WO$_3$/PEDOT:PSS heterojunction solar cells. A graph of $V_{oc}$ at various TCTA thickness in accordance with an embodiment of the invention is illustrated in FIG. 4. FIG. 4 shows that at a TCTA thickness of about 5-6 nm, $V_{oc}$ of GaAs/TCTA/WO$_3$/PEDOT:PSS heterojunction solar cells achieves a value of about 840 mV.

Many embodiments provide performances of GaAs/TCTA/WO$_3$/PEDOT:PSS heterojunction solar cells with an optimal TCTA thickness. Some embodiments include a bulk, n-type GaAs wafer with sulfur passivation, 5 nm or 10 nm of spun coat TCTA, an organic p-type semiconductor, 5 nm of evaporated WO$_3$, and a spun-coat film of highly-conductive PEDOT:PSS for lateral current transport. Certain embodiments provide that the GaAs/organic heterojunction solar cells can achieve about 830 mV $V_{oc}$. Heterojunction solar cells with about 830 mV $V_{oc}$ in accordance with certain embodiments can achieve about 20% efficiency with low-capital intensity processing.

Figure 5:
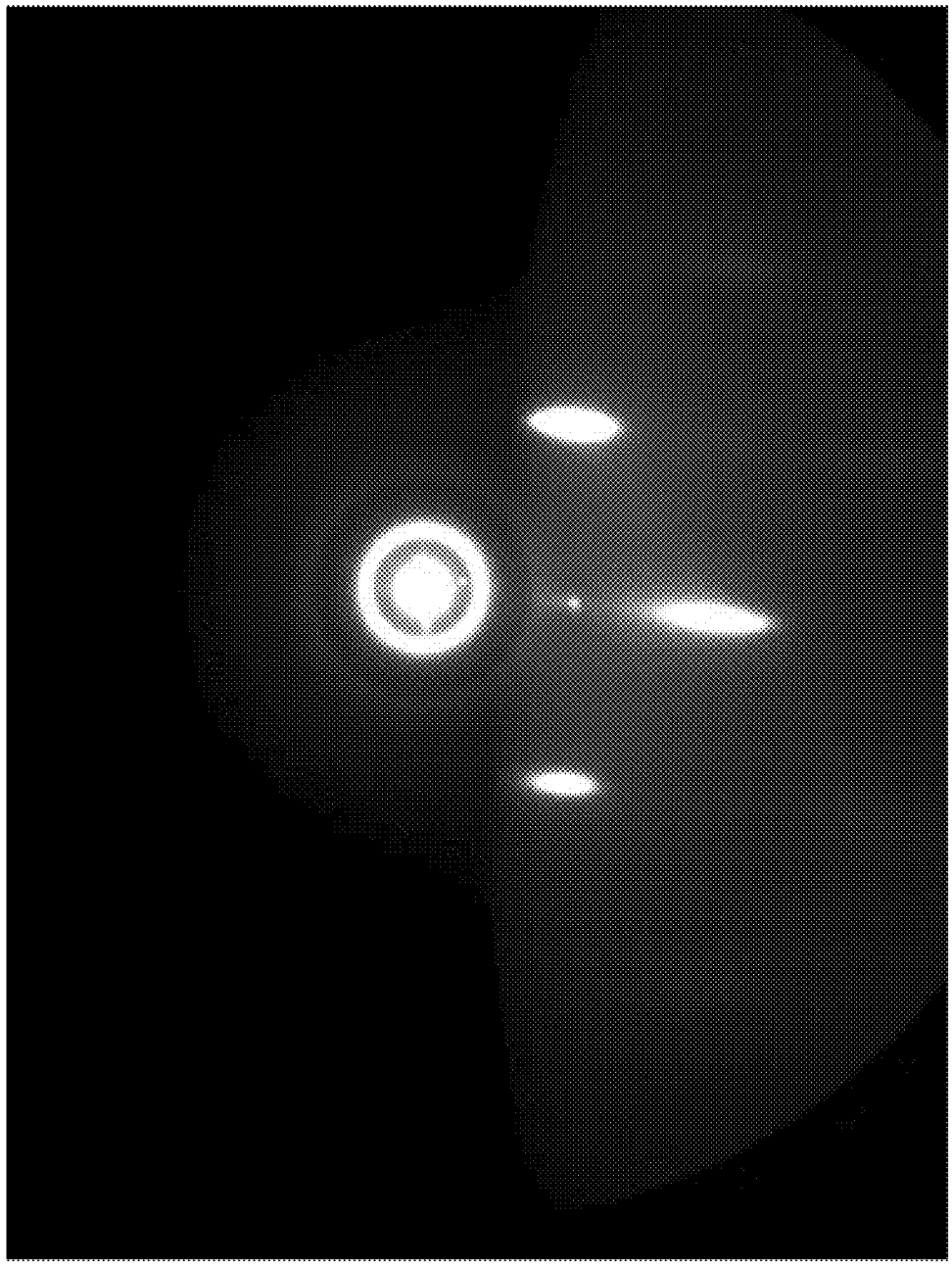
FIG. 5 illustrates RHEED image of passivated GaAs after annealing in air at 300° C. in accordance with an embodiment of the invention.

Many embodiments describe passivation processes to produce the GaAs organic heterojunction solar cells. The passivation processes are described in details in the Exemplary Embodiments. The passivation can be characterized by time-resolved photoluminescence (TRPL), where TRPL lifetimes can be calculated as a function of barrier height and then compared to the measured lifetime. The passivation layers can also be characterized by reflection high energy electron diffraction (RHEED). The passivation layers can achieve lifetimes of about 1.2 ns. The TRPL of an unpassivated sample is below the noise-floor of the instrument. The quality of the GaAs surface can be monitored with the TRPL after each step during the device formation process. After TCTA and WO$_3$ deposition the lifetime improves to about 1.4 ns, and drop to about 0.7 ns after PEDOT:PSS application. The final lifetime can be used to estimate the achievable open-circuit voltage by using it and the device thickness to calculate the steady-state carrier concentration and thus the quasi-Fermi level splitting using the relation:

$$V_{oc} = \frac{kT}{q} \ln\left(\frac{N_D \tau J_L}{q \, d \, n_i^2}\right), \quad (1)$$

where kT is the thermal voltage (26 meV), q is the elementary charge, $N_D$ is the donor concentration, $J_L$ is the photo-current density, assumed to be 30 mAcm$^{-2}$, d is the device thickness, and $n_i$ the intrinsic carrier concentration. The TRPL implies that $V_{oc}$ is about 950 mV. To further characterize the GaAs surface, RHEED can be performed after passivation to determine the nature of the surface structure. Before loading into the RHEED system, the sample is annealed at about 300° C. in air for about 5 minutes to sublimate any sulfur on the surface. The RHEED pattern is illustrated in FIG. 5 in accordance with an embodiment. The distinct diffraction spots indicate the surface is structured as opposed to disordered. From the distinct diffraction lines, some embodiments provide that the GaAs surface is structured, even after having been annealed in air. The lifetime of the annealed sample is about 0.9 ns. The maintaining of an ordered structure and about 1 ns lifetime after a variety of processing in ambient illustrate the robustness of the passivation process in accordance with certain embodiments.

Figure 6:
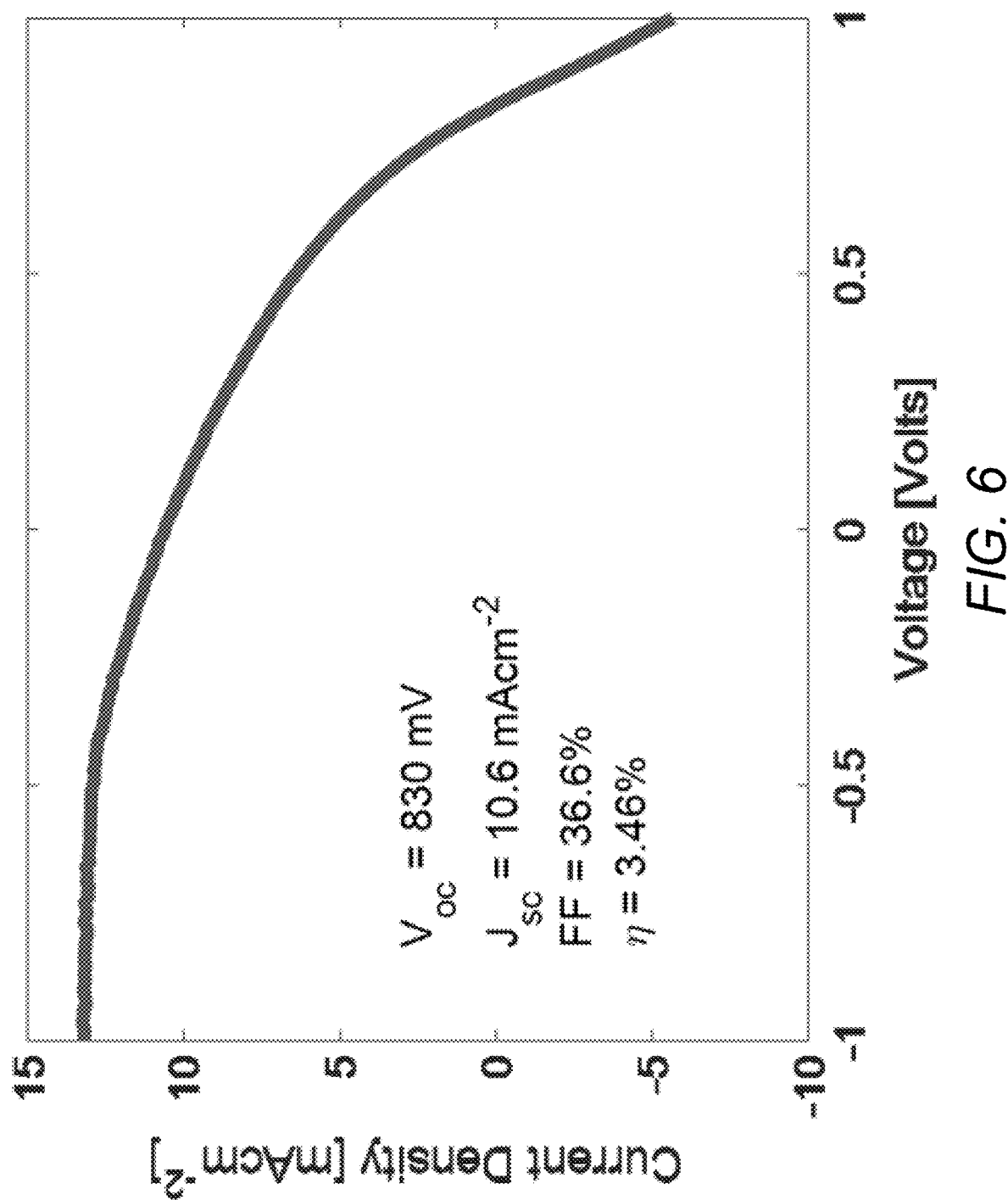
FIG. 6 illustrates a light IV curve for GaAs/TCTA/$WO_3$ heterojunction solar cell that achieves 830 mV $V_{oc}$ in accordance with an embodiment of the invention.

Some embodiments provide the electrical characterizations for GaAs organic heterojunction solar cells. The IV curve of the GaAs/TCTA/WO$_3$/PEDOT:PSS heterojunction solar cell in accordance with an embodiment of the invention is illustrated in FIG. 6. The solar cell achieves $V_{oc}$ of about 830 mV. The cell is currently limited by large series resistance and low $J_{sc}$ of about 10.6 mAcm$^{-2}$. The series resistance can be due to the sub-optimal contact design of using small dots many millimeters from each other. A saturating current in reverse bias can be observed. The low $J_{sc}$ may be due to the wafer doping which limits the depletion width, and thus charge collection depth, to less than 100 nm. A lower-doped wafer should remedy the low $J_{sc}$.

Figure 7:
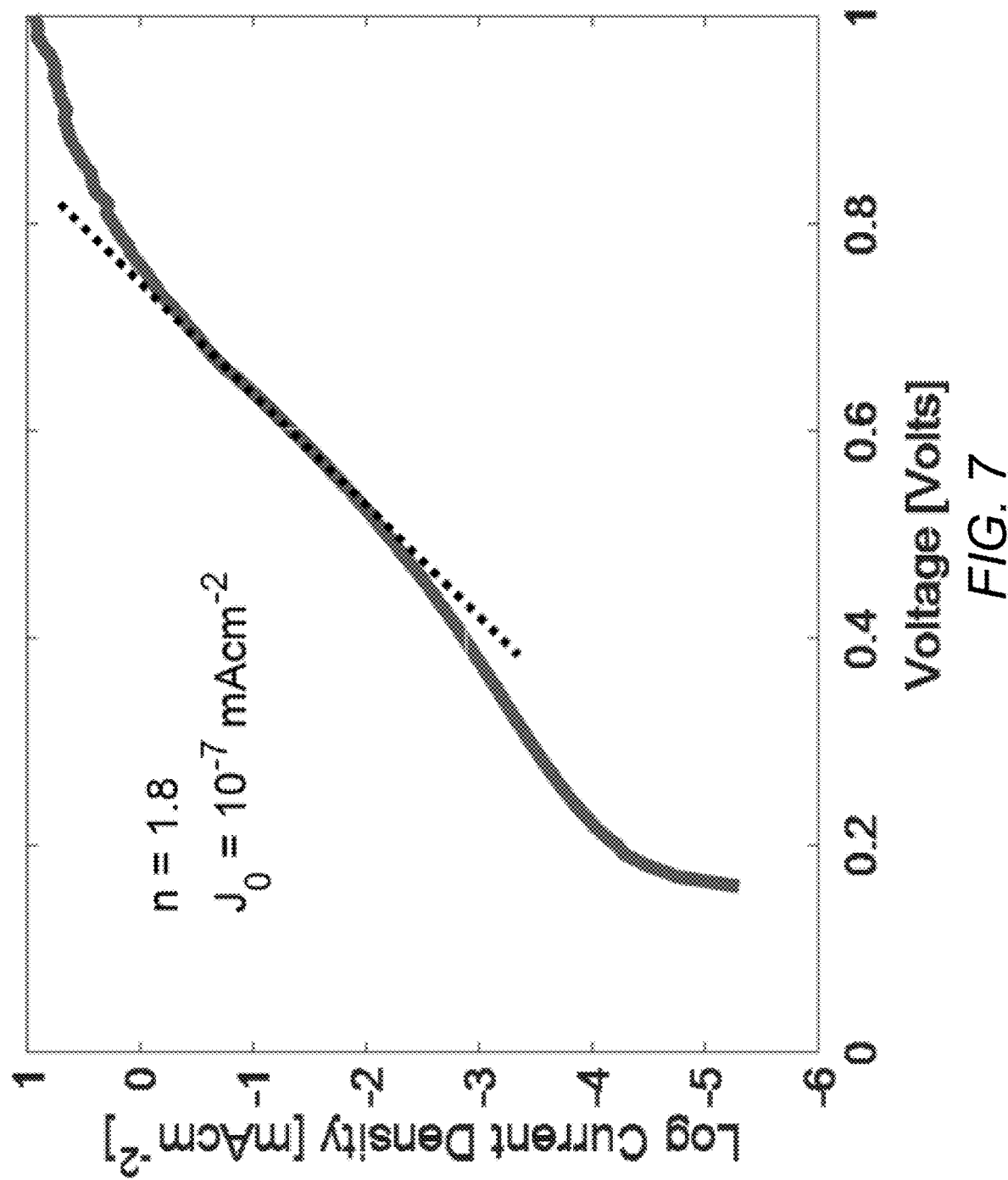
FIG. 7 illustrates a dark IV curve for GaAs/TCTA/$WO_3$ heterojunction solar cell in accordance with an embodiment of the invention.

The dark IV curve of the GaAs/TCTA/WO$_3$/PEDOT:PSS heterojunction solar cell in accordance with an embodiment of the invention is illustrated in FIG. 7. The dark IV curve is a diode with ideality factor of about 1.85 and $J_0$ of about $10^{-7}$ mAcm$^{-2}$. Using superposition and assuming short circuit current to be about 29 mAcm$^{-2}$, this device would be about 20.5% efficient. Many embodiments provide processes that allow the formation of high-quality, air-exposed GaAs surfaces that enable solar cells produced with simple processing to achieve $V_{oc}$ that can compete with commercial silicon devices. Some embodiments provide that such devices can produce about 830 mV $V_{oc}$.

GaAs/Thiol/WO$_3$ Heterojunction Solar Cells

Figure 8:
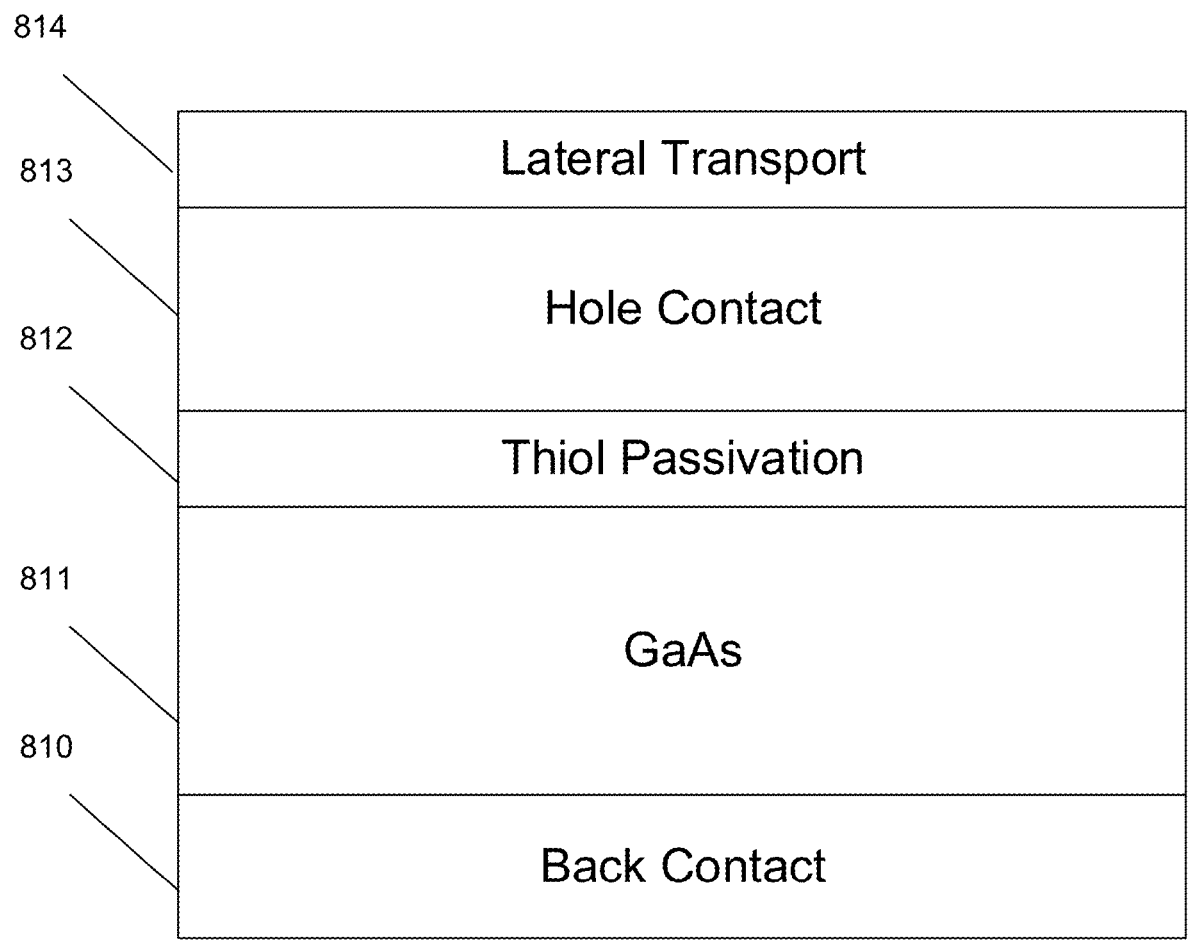
FIG. 8 illustrates a GaAs/Thiol/$WO_3$ heterojunction solar cell structure in accordance with an embodiment of the invention.

Many embodiments provide high-barrier Schottky GaAs heterojunction solar cells that can achieve high $V_{oc}$ without any epitaxial processing or external doping on a bulk wafer. A structure of GaAs/Thiol/WO$_3$ heterojunction solar cell in accordance with an embodiment of the invention is illustrated in FIG. 8. The semiconductor GaAs substrate (811) can be a n-type GaAs with about 5E16 doping density. The GaAs substrate can be about 10 μm in thickness. On the backside of the GaAs substrate, a back contact (810) can be deposited. The back contact can be a CuGe Ohmic contact. On the top side of the GaAs substrate, a passivation layer (812) can be deposited to passivate the semiconductor surface. The passivation can be a thiol containing layer including (but not limited to): OT, Cys, and DTT. A hole selective contact layer (813) that transports hole charge carriers can be coated on the passivation layer. The hole selective layers can be WO$_3$ film of about 30 nm in thickness. The thiol containing passivation layer can protect the GaAs from high work function WO$_3$ to form a high-barrier Schottky junction. A lateral transport layer (814) including (but not limited to): silver nanowires, can be deposited to improve charge transport. The Schottky barrier height of the GaAs/Thiol/WO$_3$ heterojunction solar cell measured by TRPL is about 1.38 eV. The Schottky barrier height implies a solar cell with a $V_{oc}$ of about 905 mV, and the device would be about 21.5% efficient. Table 2 lists Schottky barrier height and $V_{oc}$ of GaAs/Thiol/WO$_3$ heterojunction solar cell with various thiol containing passivation layer.

TABLE 2

| Schottky barrier height and $V_{oc}$ of GaAs/Thiol/WO$_3$ heterojunction solar cell | | | |
|---|---|---|---|
| Passivant | OT | Cys | DTT |
| Thiol τ, ns | 2.1 | 1.9 | 2.1 |
| Thiol/WO$_3$ τ, ns | 0.58 | 0.67 | 0.54 |
| Barrier, eV | 1.34 | 1.38 | 1.33 |
| Implied $V_{oc}$, eV | 0.90 | 0.91 | 0.90 |

EXEMPLARY EMBODIMENTS

Although specific embodiments of compositions, methods and process are discussed in the following sections it will be understood that these embodiments are provided as exemplary and are not intended to be limiting.

Materials and Methods

Many embodiments implement two types of GaAs wafers. First one is 100, n-GaAs wafers with $5 \times 10^{17}$ cm$^{-3}$ carrier concentration. These are used for making solar cells. Second one is n-GaAs wafers with a 50 nm GaInP layer and 1 μm GaAs layer grown on top, both with $3 \times 10^{16}$ cm$^{-3}$ carrier concentration. The wafers with epitaxial layers are used for optimizing the passivation and heterojunction formation procedures because the GaInP uniformly confines the photogenerated holes to the top GaAs layer which causes the time resolved photoluminescence (TRPL) signal to be an easy to interpret exponential decay whose lifetime indicates the surface quality.

TRPL is measured using a 405 nm Picoquant pulsed laser running just above threshold for photoexcitation, and then a single photon detector and time correlator are used for extracting the TRPL signal.

For electrically active devices, back contacts to the GaAs are made by sequentially sonicating the GaAs chip in acetone and isopropanol for three minutes each, followed by a 30 second dip in concentrated HCl to etch the native oxide, and then evaporating 100 nm of Cu followed by 50 nm of Ge without breaking vacuum, and finally annealing at 400° C. in a nitrogen purged tube furnace for 5 minutes. A CuGe contact over the AuGeNi because of the lower formation temperature and the lack of spiking.

For passivation, chips are first sonicated as above, and then an equivolume mixture of saturated ammonium hydroxide, ammonium sulfide, hydrazine monohydrate is used, with a further added 5% elemental sulfur by mass. The hydroxide, sulfide, and sulfur form a corrosive mixture that slowly etches the GaAs and terminates it with sulfur. The hydrazine may be needed for preventing residue formation. The passivation is performed by putting a small dish of water and the chips on a hotplate at 40° C., dropping the sulfide solution on the chips, and then covering the dish and chips with a petri dish for 30 minutes, followed by immediate rinsing with flowing DI water and then drying under flowing nitrogen. The small dish of water can prevent the passivation solution on the chips from drying which would result in a difficult to remove deposit on the chips. Passivation can be performed after back contact formation for electrically active devices. The process may corrod the back contacts, but they are still satisfactorily ohmic.

Thiol passivation can be formed by treatment with octanethiol, cysteine, or dithiothreitol in ethanol and ammonia solution at about 40° C. overnight.

To form the heterojunction, the wafer is first coated with TCTA by spin-coating a 0.3% by weight solution in chlorobenzene at 3000 rpm for 30 s followed by annealing on a hot plate at 130° C. for 1 minute, resulting in a 10 nm thick film. Then a thermally evaporated 5 nm of WO$_3$ is deposited at 0.2 A/s to establish a deep work function at the surface of the TCTA. Next, PEDOT:PSS doped with 10% isopropanol, 10% DMSO, 10% imidazole, and 0.1% CTAB, all by mass, is spun coat at 2000 rpm for 30 s, followed by drying on a hotplate at 130° C. for 5 minutes. The isopropanol and CTAB aid with wetting and coating, the DMSO enhances the conductivity, and the imidazole reduces the PEDOT's corrosivity. The films have about with roughly 500Ω/☐ sheet resistance, as measured by a four-point probe.

Top metal contacts are 100 nm thick gold squares defined by 0.01 mm$^2$ square holes in a shadow-mask deposited by electron-beam evaporation at 2 A/s. Edge isolation is done with a razor blade. Cells are characterized using an AM 1.5 g solar simulator calibrated with a silicon reference cell.

DOCTRINE OF EQUIVALENTS

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A heterojunction solar cell, comprising:
   at least one back contact;
   at least one semiconductor substrate, wherein the at least one semiconductor substrate is an n-type doped GaAs or a p-type doped GaAs;
   at least one passivation layer, wherein the at least one passivation layer passivates one surface of the at least one semiconductor substrate and comprises one of: at least one thiol group, 1,3-Diisopropylimidazolium Hydrogencarbonate (NHC), or at least one sulfide ion;
   at least one contact layer, wherein the at least one contact layer is a hole transport layer or an electron transport layer, and the contact layer is on top of the at least one passivation layer; wherein the hole transport layer comprises one of poly(3,4-ethylenedioxythiophene) polystyrene sulfonate (PEDOT:PSS), 2,2',7,7'-Tetrakis [N,N-di(4-methoxyphenyl)amino]-9,9'-spirobifluorene (SPIRO), SPIRO doped with 5 wt % Tris(pentafluorophenyl)borane, tris(4-carbazoyl-9-ylphenyl)amine (TCTA), TCTA doped with 5 wt % Tris(pentafluorophenyl)borane, polystyrene (PS), 4,4'-Bis(N-carbazolyl)-1,1'-biphenyl(CBP), copper (1) iodide (CuI) dissolved in acetonitrile, polyvinyl alcohol (PVA), copper thiocyanate (CuSCN), 1,1-Bis[(di-4-tolylamino)phenyl]cyclohexane (TAPC), TAPC doped with 5 wt % Tris(pentafluorophenyl)borane, poly(triaryl amine) (PTAA), PTAA doped with 5 wt % Tris(pentafluorophenyl)borane, nickel oxide (NiO) nanoparticles, or NiO film; and
   at least one electrode modified layer, wherein the at least one electrode modified layer is on top of the at least one contact layer;
   wherein the at least one passivation layer is positioned between the at least one semiconductor substrate and the at least one contact layer and bonds to both the at least one semiconductor substrate and the at least one contact layer;
   wherein the open circuit voltage of the solar cell is at least 830 mV; and
   wherein the heterojunction solar cell is non-epitaxial.

2. The non-epitaxial heterojunction solar cell of claim 1, wherein the at least one back contact is an ohmic contact comprising Cu and Ge.

3. The non-epitaxial heterojunction solar cell of claim 1, wherein the organic film comprises octanethiol (OT), 3,3,4, 4,5,5,6,6,7,7,8,8-tridecafluoro-1-octanethiol (FOT), pentafluorothiophenol (PFBT), dithiothreitol (DTT), or cysteine (Cys).

4. The non-epitaxial heterojunction solar cell of claim 1, wherein the at least one passivation layer comprises ammonium sulfide.

5. The non-epitaxial heterojunction solar cell of claim 1, wherein the electron transport layer comprises one of tin oxide ($SnO_2$) nanoparticles, aluminum doped zinc oxide (AZO) nanoparticles, or C60.

6. The non-epitaxial heterojunction solar cell of claim 1, wherein the at least one semiconductor substrate is an n-type doped GaAs and the at least one electrode modified layer comprises tungsten trioxide ($WO_3$) or molybdenum trioxide ($MoO_3$).

7. The non-epitaxial heterojunction solar cell of claim 1, wherein the at least one semiconductor substrate is a p-type doped GaAs and the at least one electrode modified layer comprises lithium fluoride (LiF) or caesium oxide ($Cs_2O$).

8. The non-epitaxial heterojunction solar cell of claim 1, further comprising a lateral current transport layer, wherein the lateral current transport layer comprises poly (3,4-ethylenedioxythiophene) polystyrene sulfonate (PEDOT:PSS), indium tin oxide (ITO), or silver nanowires.

\* \* \* \* \*